United States Patent
Shin et al.

(10) Patent No.: US 8,338,874 B2
(45) Date of Patent: Dec. 25, 2012

(54) FLASH MEMORY DEVICE WITH AN ARRAY OF GATE COLUMNS PENETRATING THROUGH A CELL STACK

(75) Inventors: Hack Seob Shin, Suwon-si (KR); Kyoung Hwan Park, Seoul (KR); Young Ok Hong, Icheon-si (KR); Yu Jin Park, Gyeongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/469,206

(22) Filed: May 11, 2012

(65) Prior Publication Data

US 2012/0217572 A1 Aug. 30, 2012

Related U.S. Application Data

(62) Division of application No. 12/857,678, filed on Aug. 17, 2010, now Pat. No. 8,203,177, which is a division of application No. 12/212,819, filed on Sep. 18, 2008, now Pat. No. 7,867,831.

(30) Foreign Application Priority Data

May 28, 2008 (KR) .................. 10-2008-0049571
May 28, 2008 (KR) .................. 10-2008-0049572
May 28, 2008 (KR) .................. 10-2008-0049581

(51) Int. Cl.
*H01L 29/76* (2006.01)
(52) U.S. Cl. ........ 257/314; 257/324; 257/326; 438/216; 438/588
(58) Field of Classification Search .................. None
See application file for complete search history.

(56) References Cited

U.S. PATENT DOCUMENTS

| | | | |
|---|---|---|---|
| 5,308,778 A * | 5/1994 | Fitch et al. ............. | 438/128 |
| 6,870,215 B2 | 3/2005 | Endoh et al. | |
| 7,382,018 B2 | 6/2008 | Kim et al. | |
| 7,821,058 B2 | 10/2010 | Kidoh et al. | |
| 2004/0041189 A1 | 3/2004 | Voshell et al. | |
| 2006/0186446 A1 | 8/2006 | Kim et al. | |
| 2007/0076477 A1 | 4/2007 | Hwang et al. | |
| 2007/0102750 A1 | 5/2007 | Kim et al. | |
| 2007/0252201 A1 | 11/2007 | Kito et al. | |
| 2007/0272973 A1 | 11/2007 | Park et al. | |
| 2009/0097321 A1 | 4/2009 | Kim et al. | |

FOREIGN PATENT DOCUMENTS

| | | |
|---|---|---|
| KR | 10-1999-0084797 | 12/1999 |
| KR | 10-2006-0051240 | 5/2006 |
| KR | 10-2006-0063279 | 6/2006 |
| KR | 10-2006-0089547 | 8/2006 |
| KR | 10-0707217 | 4/2007 |
| KR | 10-2007-0096972 | 10/2007 |
| KR | 10-2007-0103200 | 10/2007 |
| KR | 10-2007-0109170 | 11/2007 |
| KR | 10-2009-0123481 | 12/2009 |

* cited by examiner

*Primary Examiner* — Evan Pert
*Assistant Examiner* — Andres Munoz
(74) *Attorney, Agent, or Firm* — Marshall, Gerstein & Borun LLP

(57) ABSTRACT

A flash memory device includes a substrate; a cell stack having a semiconductor layer for providing junction areas and channel areas and an interlayer isolation layer for insulating the semiconductor layer, wherein the semiconductor layer and the interlayer isolation layer are repeatedly stacked; an array of gate columns, the gate columns penetrating through the cell stack, perpendicular to the substrate; and a trap layered stack introduced into an interface between the gate columns and the cell stack to store charge.

3 Claims, 23 Drawing Sheets

FLASH MEMORY DEVICE WITH AN ARRAY OF GATE COLUMNS PENETRATING THROUGH A CELL STACK

CROSS-REFERENCE TO RELATED APPLICATIONS

This is a division of U.S. application Ser. No. 12/857,678 filed Aug. 17, 2010, which is a division of U.S. application Ser. No. 12/212,819 filed Sep. 18, 2008, which claims priority to Korean patent application numbers 10-2008-0049571, 10-2008-0049572 and 10-2008-0049581, filed on May 28, 2008, the entire respective disclosures of which are incorporated herein by reference.

TECHNICAL FIELD

This patent relates to a semiconductor device, and more particularly, to a flash memory device.

BACKGROUND OF THE INVENTION

Demand for a non-volatile memory device that maintains the stored state of information even when power is interrupted has been increased. As an example of the non-volatile memory device, a flash memory device in which memory cells are connected as a NAND string by sharing junctions is widely used to store massive information. As increase in memory capacity of the NAND flash memory device is required, decrease in size of a cell transistor that forms the memory cell has been largely required and increase in integration degree by this decrease in size of a cell transistor is also required.

In order to realize a smaller sized cell transistor, decrease in critical dimension size of a gate of the transistor is required. However, the decrease in critical dimension size has been limited by limitation in exposing resolution for pattern transcription. Also, as the size of the cell gate is decreased to tens nm, for example to less than 40 nm, cell current is rapidly reduced and this causes deterioration in operation properties of the transistor. Such limitation in exposing resolution or reduction in cell current limits decrease in memory cell size and consequently limits increase in integration degree of a memory device.

In order to overcome the limitation in integration degree of a memory device, trials for stacking cell transistors in a direction perpendicular to a substrate has been suggested instead of realizing planar cell transistors. In consideration of the limitation in integration of planar transistors into a limited substrate area, the stacking of transistors in a direction perpendicular to a substrate will overcome this limitation to the planar area. Therefore, in order to realize a memory device with higher integration degree, it may be considered a solution in that cell transistors are stacked in a direction perpendicular to a substrate and the stacked transistors are electrically connected with one another to constitute NAND strings.

SUMMARY OF THE INVENTION

In an embodiment of the invention, a method for manufacturing a flash memory device includes forming a semiconductor layer over a substrate; forming junction areas for setting areas therebetween to channel areas in the semiconductor layer in a shape of a stripe; forming an interlayer isolation layer for insulation over the semiconductor layer; forming a cell stack by repeatedly stacking the semiconductor layer formed with the junction areas and the interlayer isolation layer; forming an array of through holes that penetrate through the cell stack and cut through the junction areas to dispose the junction areas at both sides thereof; forming a trap layered stack for storing charges over the inner wall of the through hole; and forming a gate column for filling in the through hole over the trap layered stack.

In another embodiment of the invention, a method for manufacturing a flash memory device includes forming a semiconductor layer over a substrate; forming junction areas for setting areas therebetween to channel areas in the semiconductor layer in a shape of a stripe; forming an interlayer isolation layer for insulation over the semiconductor layer; forming a cell stack by repeatedly stacking the semiconductor layer formed with the junction areas and the interlayer isolation layer; forming an array of through holes that penetrate through the cell stack and cut through the junction areas to dispose the junction areas at both sides thereof; forming a trap layered stack for storing charges over the inner wall of the through hole; forming a gate column for filling in the through hole over the trap layered stack; forming an etch mask that covers the gate columns and the junction areas and exposes some portion of the channel area between the rows of the gate columns in a direction parallel to the direction in which the junction areas and the gate columns are arranged; forming an interstack isolation trench by selectively removing the portion of the cell stack exposed by the etch mask; and forming an interstack isolation layer for isolating between the cell strings by filling in the interstack isolation trench.

In further another embodiment of the invention, a method for manufacturing a flash memory device includes forming a semiconductor layer over a substrate; forming junction areas for setting areas therebetween to channel areas in the semiconductor layer in a shape of a stripe; forming a first sub interlayer isolation layer for insulation over the semiconductor layer; forming a contact connected to the junction area, the contact penetrating through the first sub interlayer isolation layer; forming a bit line connected to the contact over the first sub interlayer isolation layer; forming an interlayer insulation layer provided with the bit line buried therein by forming a second sub interlayer isolation layer for covering and insulating the bit line; forming a cell stack by repeatedly stacking the semiconductor layer formed with the junction areas and the interlayer isolation layer; forming an array of through holes that penetrate through the cell stack and cut through the junction areas to dispose the junction areas at both sides thereof; forming a trap layered stack for storing charges over the inner wall of the through hole; and forming a gate column for filling in the through hole over the trap layered stack.

In yet another embodiment of the invention, a method for manufacturing a flash memory device includes forming a semiconductor layer over a substrate; forming junction areas for setting areas therebetween to channel areas in the semiconductor layer in a shape of a stripe; forming a first sub interlayer isolation layer for insulation over the semiconductor layer; forming a contact connected to the junction area, the contact penetrating through the first sub interlayer isolation layer; forming a bit line over the first sub interlayer isolation layer, the bit line being connected to the contact and extending in a direction perpendicular to the cell string direction; forming an interlayer insulation layer provided with the bit line buried therein by forming a second sub interlayer isolation layer for covering and insulating the bit line; forming a cell stack by repeatedly stacking the semiconductor layer formed with the junction areas and the interlayer isolation layer; forming an array of through holes that penetrate through the cell stack and cut through the junction areas to dispose the junction areas at both sides thereof; forming a trap layered stack for storing charges over the inner wall of the through hole; and forming a gate column for filling in the through hole over the trap layered stack.

In still another embodiment of the invention, a flash memory device includes a substrate; a cell stack having a semiconductor layer, in which junction areas for setting areas therebetween to channel areas are formed in a shape of a stripe, and an interlayer isolation layer for insulating the semiconductor layer, wherein the semiconductor layer and the interlayer isolation layer are repeatedly stacked; an array of gate columns, the gate column penetrating through the cell stack, perpendicular to the substrate and cutting through the junction areas to dispose the junction areas at both sides thereof; and a trap layered stack introduced into an interface between the gate column and the cell stack to store charge.

The array of the gate columns may penetrate through the cell stack so that the junction areas are dividedly disposed at both sides of the gate column, a channel area is set laterally of the gate column between the divided junction areas, a plurality of cell transistors including the gate column, the junction area and the channel area forms a NAND cell string in the extending direction of the junction area, the cell transistors formed in different semiconductors are connected to the same gate column, and the junction area is divided into a plurality of individual junction areas.

The trap layered stack may include a stack of a charge tunnel layer, a charge trap layer and a charge block layer.

In still another embodiment of the invention, a flash memory device includes a substrate; a cell stack having a semiconductor layer, in which junction areas for setting areas therebetween to channel areas are formed in a shape of a stripe, and an interlayer isolation layer for insulating the semiconductor layer, wherein the semiconductor layer and the interlayer isolation layer are repeatedly stacked; an array of gate columns, the gate column penetrating through the cell stack, perpendicular to the substrate and cutting through the junction areas to dispose the junction areas at both sides thereof; a trap layered stack introduced into an interface between the gate column and the cell stack to store charge; and an interstack isolation layer penetrating through some portion of the channel area between the rows of the gate column and the junction area to isolate between the rows.

The interstack isolation layer is overlappedly expanded to some portion of the junction area and some portion of the gate column so that the overlapped portions of the junction area and gate column are cuttingly removed by the interstack isolation layer.

In still another embodiment, a flash memory device includes: a substrate; a cell stack having a semiconductor layer, in which junction areas for setting areas therebetween to channel areas are formed in a shape of a stripe, and an interlayer isolation layer which insulates the semiconductor layer and is provided with a bit line buried therein and connected to the junction area, wherein the semiconductor layer and the interlayer isolation layer are repeatedly stacked; an array of gate columns, the gate column penetrating through the cell stack, perpendicular to the substrate and cutting through the junction areas to dispose the junction areas at both sides thereof; and a trap layered stack introduced into an interface between the gate column and the cell stack to store charge.

The interstack isolation layer may include a first sub interlayer isolation layer formed over the semiconductor layer and penetrated through by a contact in contact with the junction area; a second sub interlayer isolation layer extending to be penetrated through by the bit line connected to the contact; and a third sub interlayer isolation layer for covering the bit line and the second sub interlayer isolation layer.

The bit line may be disposed at the position that is laterally spaced apart from the stripe of the junction area and overlapped on the portion of the channel area, and extends in parallel along the extending direction of the stripe of the junction area.

The flash memory device may further include an interstack isolation layer penetrating through and dividing the portion of the cell stack that is overlapped in another portion of the channel area opposite to the portion of the channel area with the overlappedly disposed bit lines.

The flash memory device may further include a common source column penetrating the cell stack and laterally and electrically connected to the junction area.

In still another embodiment of the invention, a flash memory device includes a substrate; a cell stack having a semiconductor layer, in which junction areas for setting areas therebetween to channel areas are formed in a shape of a stripe, and an interlayer isolation layer which insulates the semiconductor layer and is provided with a bit line buried therein, connected to the junction area and extending in a direction perpendicular to the cell string direction, wherein the semiconductor layer and the interlayer isolation layer are repeatedly stacked; an array of gate columns, the gate column penetrating through the cell stack, perpendicular to the substrate and cutting through the junction areas to dispose the junction areas at both sides thereof; and a trap layered stack introduced into an interface between the gate column and the cell stack to store charge.

The flash memory device may further include an interstring isolation layer in the semiconductor layer, which insulates the channel area and the junction area and extends in the cell string direction.

BRIEF DESCRIPTION OF THE DRAWINGS

For a more complete understanding of the disclosure, references should be made to the following detailed description and accompanying drawings wherein.

DESCRIPTION OF SPECIFIC EMBODIMENTS

Figure 1:
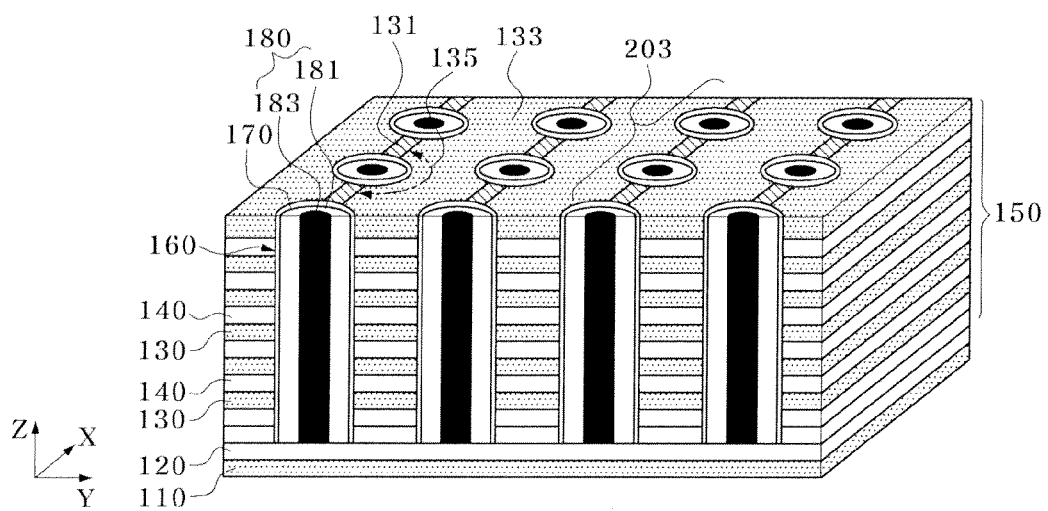
FIG. 1 is a perspective view illustrating gate columns that penetrates through a cell stack of a flash memory device in accordance with one embodiment of the invention.

While the subject matter of this patent is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims. Throughout the following detailed description, similar reference numbers refer to respective similar elements in all figures of the drawings.

In the embodiments of the invention, a semiconductor layer including a channel area and a junction area is formed over a wafer or a substrate and then an interlayer isolation layer for insulating between devices is formed over the semiconductor layer. With repeated stacking of the semiconductor layer and interlayer isolation layer, a cell stack in that the semiconductor layers and the interlayer isolation layers are repeatedly stacked is formed. After that, gate columns that cut through the middle of the junction areas set in the semiconductor layers to dispose junctions at both sides thereof are formed perpendicular to a surface of the substrate. Cell transistors constituting a memory cell are connected in the form of a NAND string in the extending direction of the stripe shape. In order to isolate this NAND cell string from other adjacent cell string, an interstack isolation layer that penetrates vertically through the cell stack is formed in the channel area between rows of the gate stacks. At this time, the interstack isolation layer may be formed by performing selective etching and deposition of an insulation layer after stacking of the cell stack.

The cell transistors constituting a memory cell are connected in the form of a NAND string in the extending direction of the stripe shape, and bit lines are connected to an end of the string. The bit line is buried within the interlayer isolation layer and extends along the extending direction of the cell string or a direction perpendicular to the direction of the cell string on a plane. Also, a common source column is formed, like the gate column, to penetrate through and connected to the junction so that the common source column is connected to the other end of the string.

In the flash memory device constructed as described above, since the transistors formed in respective stacked semiconductor layers are connected to the gate column formed perpendicular to the surface of the substrate, the perpendicular gate column is set as a word line. Likewise, source selection lines or source selection transistors formed in respective stacked semiconductor layers are connected to the common source column perpendicular to the surface of the substrate. Meanwhile, the bit lines extending in a direction parallel to the surface of the substrate are formed so as to be stacked in correspondence to individual semiconductor layer. Therefore, the individual bit line is connected to a drain selection transistor or a drain selection line (DSL) at an end of the cell string. At this time, two cell strings are commonly connected to both sides of the common source column and the bit line is connected to each of the two cell string.

Referring now to FIGS. 1 to 4, a cell stack 150 is stacked over a wafer or a substrate 110. The substrate 110 may be formed, for example, from a p-type silicon (Si) substrate dope with p-type impurities as dopant. In order to stack the cell stack 150 over the substrate 110, a bottom isolation layer 120 is deposited over the substrate 110, for example, with an insulation material such as silicon oxide.

A semiconductor layer 130 is deposited over the bottom isolation layer 120 in which a junction area 131 and and a channel area 133 are formed. The junction area 131 functions as a source area or a drain area. The semiconductor layer 130 may be formed, for example, from a p-type Si doped with p-type impurities as dopant. The junction area 131 may be formed in the semiconductor layer 130 as an area doped with, for example, n-type impurities. The junction area 131 may be formed, for example, to have a layout of a stripe shape that extends in an X-axis direction, along which a NAND cell string (not shown) extends, in a XYZ three dimensional coordinate. As shown in FIG. 1, more than one junction and channel areas 131, 133 are illustrated.

Figure 2:
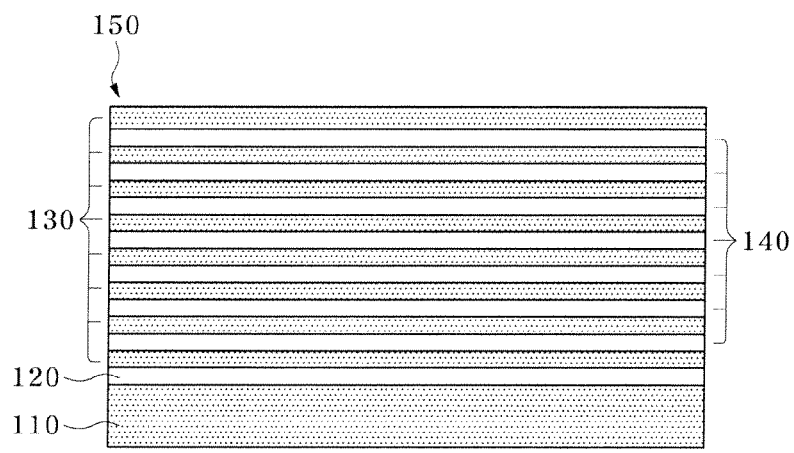
FIG. 2 is a cross-sectional view illustrating the cell stack of the flash memory device in accordance with one embodiment of the invention.

An interlayer isolation layer 140 for insulating the semiconductor layer 130 is deposited over the semiconductor layer 130, for example, with a silicon material such as silicon oxide. As shown in FIG. 2, the semiconductor layer 130 and the interlayer isolation layer 140 are sequentially and repeatedly stacked to form the cell stack 150. Referring back to FIGS. 1-3, an array of gate columns 180 penetrates through the cell stack 150 and stands in a Z-axis direction perpendicular to the surface of the substrate 110 is formed. The gate column 180 cuts through the middle of the junction area 131 and divides the junction area 131 into first and second junction areas 137 and 138 disposed at both sides of the gate column 180. The channel area 133 is set in the portion of the semiconductor layer 130 located between the first and second junction areas 137 and 138 beside the gate column 180. Upon operation of the cell transistor comprising the gate column 180, first and second junction areas 137 and 138, as the channel area 133 is turned on by applying read voltage on the gate column 180, a cell current 135 may flow either from the first junction area 137 to the second junction area 138 or vice versa via the channel area 133.

Figure 4:
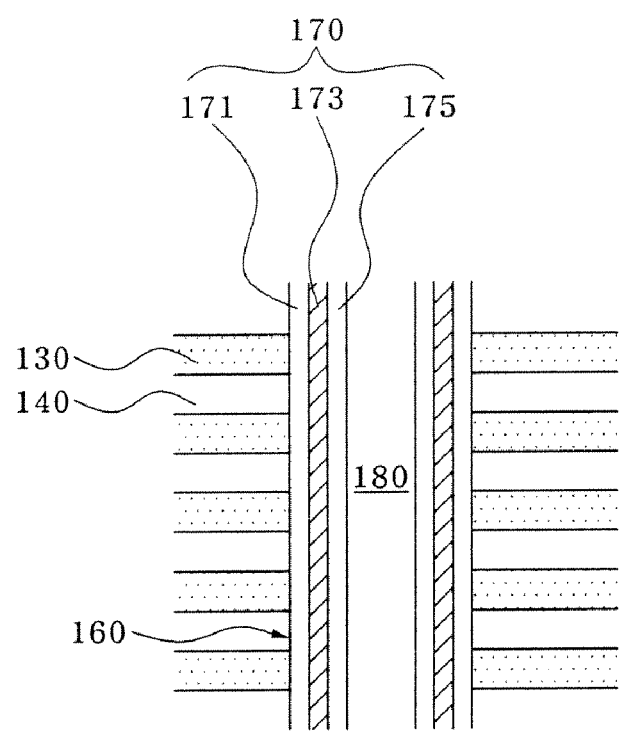
FIG. 4 is a cross-sectional view illustrating a trap layered stack of the flash memory device in accordance with one embodiment of the invention.

As shown in FIGS. 1 and 4, an array of through holes 160 penetrates the cell stack 150 is formed. A trap layered stack 170 for storing information is introduced in an interface between the gate column 180 and a side wall of the through hole 160. The trap layered stack 170 may be formed, for example, in a stacked structure and extends vertically within the through hole 160. The trap layered stack 170 may include a tunnel layer 171 for the charge tunneling, a trap layer 173 for the charge trap, and a block layer 175 for restricting undesired back tunneling. The tunnel layer 171 is deposited directly over the wall surface of the through hole 160 so as to extend vertically along the wall surface of the through hole 160. The trap layer 173 is deposited over the tunnel layer 171 and extends vertically within the through hole 160. The block layer 175 is deposited in an interface between the trap layer 173 and the gate column 180.

The trap layered stack 170 may be introduced, for example, in a stack of oxide/nitride/oxide (ONO) or a stack of oxide/nitride/high K dielectric. The tunnel layer 171 may be formed, for example, from an oxide, a high K dielectric layer or an ONO layer. The trap layer 173 may be formed, for example, from a nitride layer, a nano-dot layer or a floating gate structure. The block layer 175 may be formed, for example, from an ONO layer or an oxide layer.

Figure 3:
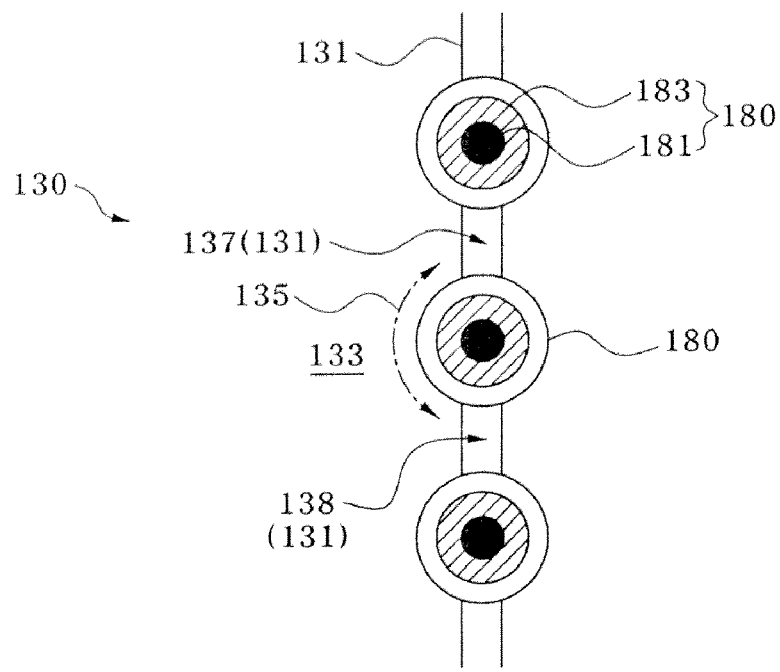
FIG. 3 is a plan view illustrating cell transistors of the flash memory device in accordance with one embodiment of the invention.

As shown in FIGS. 1 and 3, the vertical gate column 180 includes a conductive polysilicon layer 181 and a metal layer 183 such as tungsten (W) layer. The gate column 180 may be used as a word line WL for cell transistors that constitutes the NAND cell string, as a source selection line SSL for the source selection transistor adjacent to a common source line of the NAND cell string, or as a drain selection line DSL for a drain selection transistor adjacent to the bit line BL. A cell array and structures of the bit line BL and the source line SL of the flash memory device described above are shown in FIG. 5.

Figure 5:
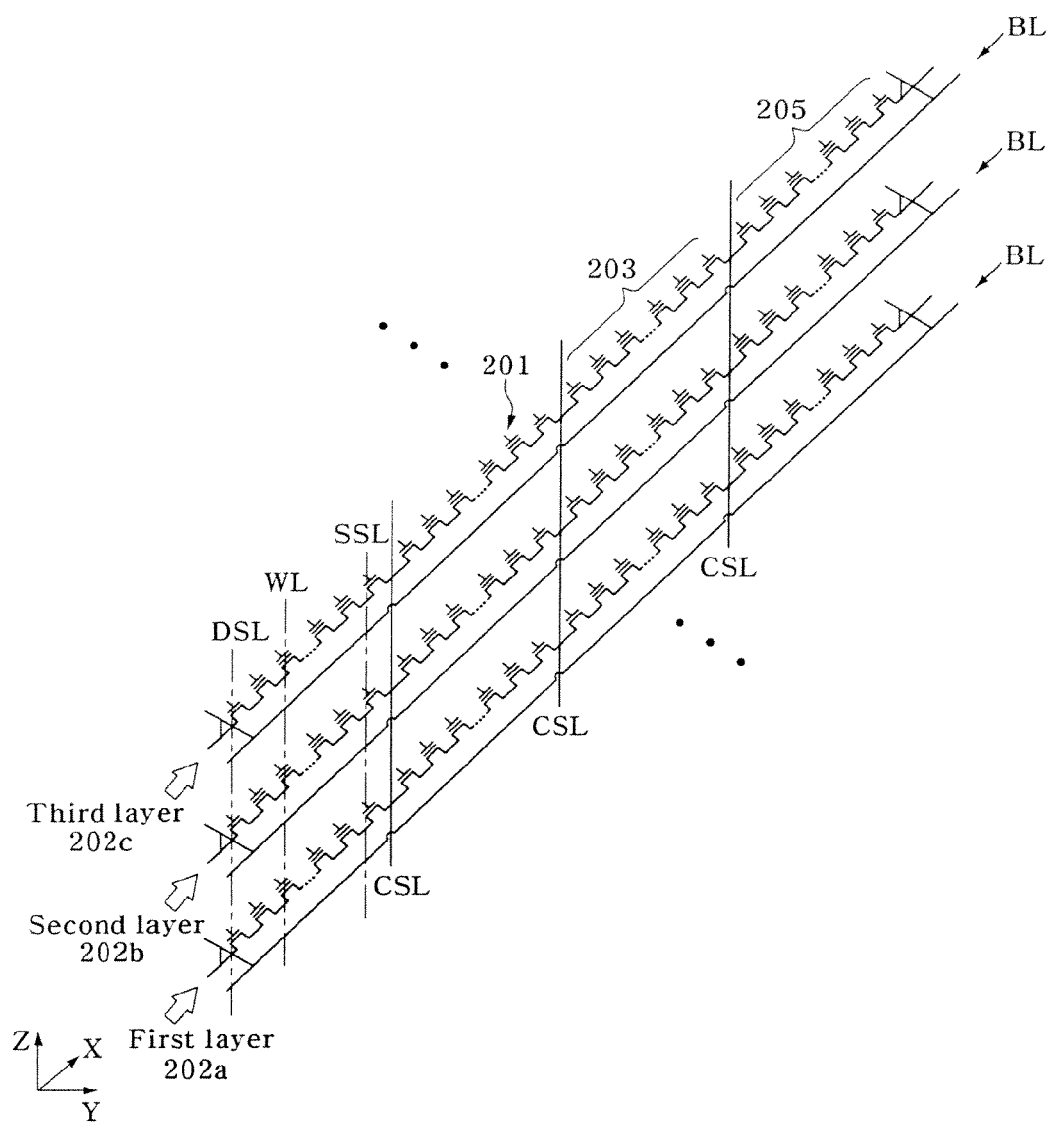
FIG. 5 is a view illustrating a cell array of the flash memory device in accordance with one embodiment of the invention.
Figure 6:
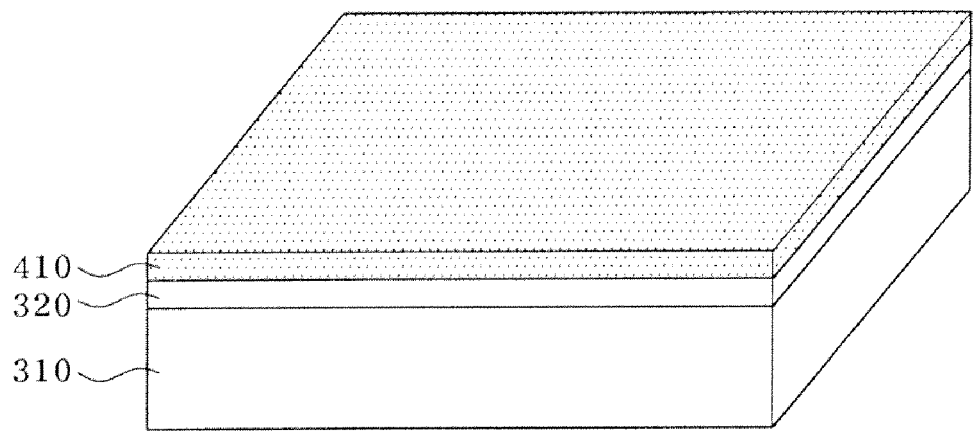
FIGS. 6 to 20 are views illustrating the process steps of manufacturing the flash memory device in accordance with one embodiment of the invention.

Referring now to FIG. 5 together with FIG. 1, the cell transistors 201 include the gate column 180 and the junction and channel areas 131, 133 of the semiconductor layer 130, and the cell transistors 201 formed in a first layer 202a, a second layer 202b, and a third layer 202c. These layers 202a, 202b, 202c are connected to the word line WL of the vertical gate column 180. Also, in the respective layers 202a, 202b, 202c, the cell transistors 201 are arranged in the X-axis direction, i.e. a cell string direction in which the junction area 131 extends and are connected in plural by the junction area 131 to constitute first and second cell strings 203 and 205. The first cell string 203 and the second cell string 205 are commonly connected to a vertical common source line CSL and the cell strings 203, 205 in the first, second and third layers 202a, 202b, 202c of the cell transistors are also common to the vertical common source line CSL. Therefore, the common source line CSL is, like the gate column 180, also introduced so as to penetrate through the cell stack 150. Unlike the gate column 180, the common source line CSL is not provided with the trap layered stack 170 and this common source line CSL is in contact with the junction area 131 of the semiconductor layer 130 to directly and electrically connect the junction area 131. The gate column 180 adjacent to the common source line CSL is used as the source selection line SSL.

The bit line BL connected to the cell strings 203 and 205 is introduced separately and independently in the respective layers 202a, 202b, 202c. As shown in FIG. 5, the bit line BL is electrically connected to each of the cell strings 203 and 205 that are common to the single common source line CSL and extends in a cell string direction in which the cell strings 203 and 205 extend, i.e. the X-axis direction. As such, in consideration of forming the cell array and stacking the bit lines BL that extend in the cell string direction to form an interstring isolation structure is advantageous, for isolating the cell string 203 from other cell strings adjacent in the Y-axis direction and perpendicular to the X-axis direction, in the semiconductor layer 130. The bit line BL may be formed in a structure that is buried in the interlayer isolation layer 140 of the cell stack 150, i.e. a buried bit line structure.

Referring now to FIGS. 6-19, a bottom isolation layer 320 is deposited over a substrate or a wafer 310. The bottom isolation layer 320 may be formed, for example, with an insulation material such as silicon oxide. The substrate 310 may be formed, for example, from a p-type silicon (Si) substrate doped with p-type impurities as dopant. A semiconductor layer 410 is deposited over the bottom isolation layer 320. The semiconductor layer 410 may be formed, for example, from a p-type Si layer doped with p-type impurities as dopant.

Figure 7:
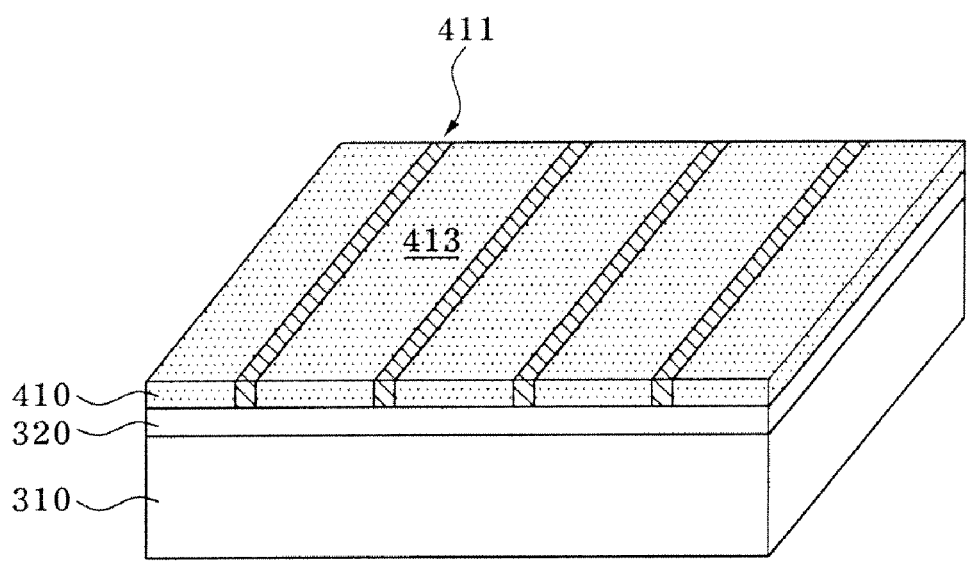

As shown in FIG. 7, an array of junction areas 411 is formed, for example, in a stripe layout and extends in a predetermined direction, e.g. a direction of the NAND cell string. The junction area 411 may be formed, for example, by doping n-type impurities that are opposite conductive type on the semiconductor layer 410 through a selective ion implantation using an ion implantation mask. A channel area 413 is set between the junction area 411 and other adjacent junction areas 411. On the channel area 413, the ion implantation for adjusting a threshold voltage of the cell transistor may be further carried out.

Figure 8:
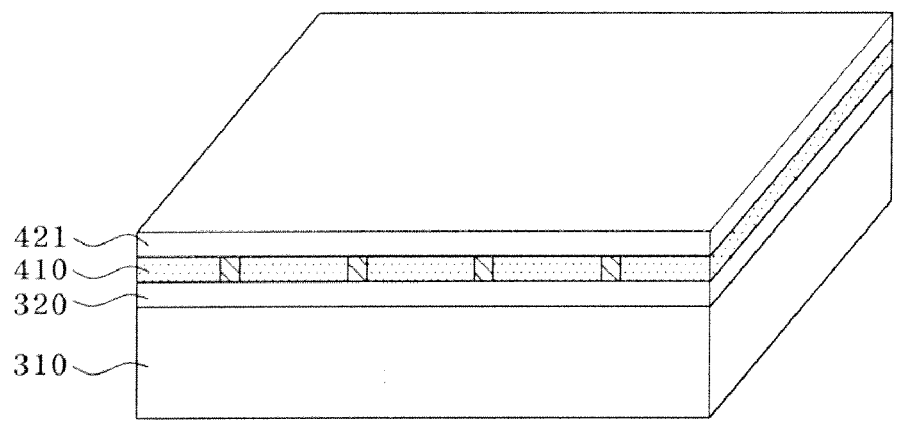

As shown in FIG. 8, a first sub interlayer isolation layer 421 for insulation is formed over the semiconductor layer 410 by depositing an insulation material such as silicon oxide.

Figure 9:
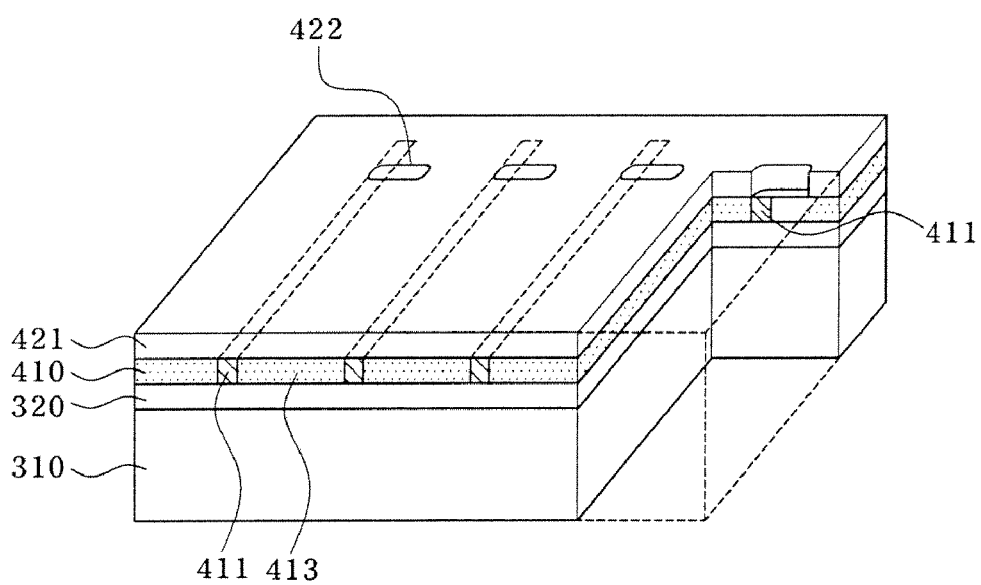

In order to form a drain contact 502 connected to a drain in the junction area 411, an array of contact holes 422 penetrates through the first sub interlayer isolation layer 421 is formed, as shown in FIG. 9. The contact hole 422 exposes some portion of the junction area 411 of the semiconductor layer 410. Alternatively, the contact hole 422 may be expanded to expose some portion of the channel area 413 adjoining to the junction area 411 for the purpose of contact connection with the bit line BL so that the bit line BL extends parallel to the junction area 411 and positions over the channel area 413. The ion implantation for improving a contact resistance may be carried out on the exposed portion of the semiconductor layer 410.

Figure 10:
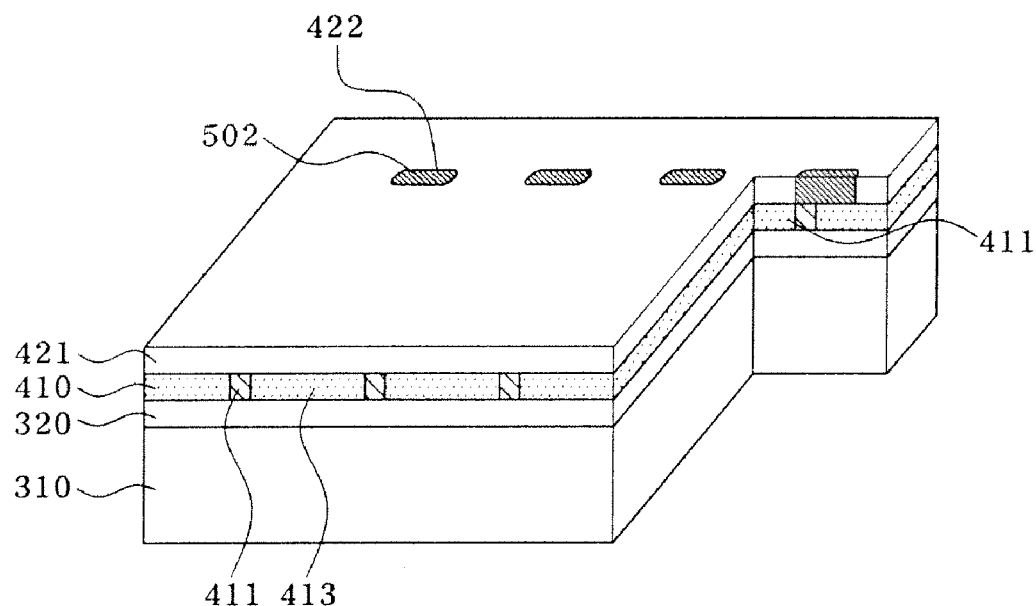

Referring now to FIG. 10, the contact hole 422 is filled with the drain contact 502. The drain contact 502 may be formed, by depositing, for example, a conductive material such as a conductive polysilicon layer or a metal layer such as tungsten (W) layer, in the contact hole 422 and then performing a contact node separation through a planarization method such as chemical mechanical polishing (CMP).

Figure 11:
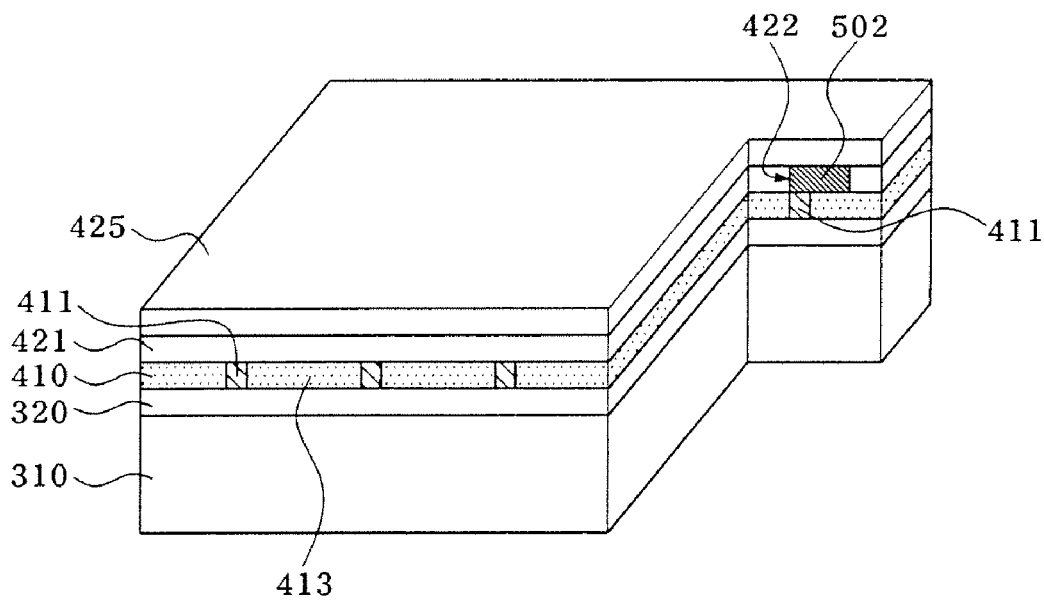

A second sub interlayer isolation layer 425 is formed by depositing, for example, an insulation material over the first sub interlayer isolation layer 421, as shown in FIG. 11.

Figure 12:
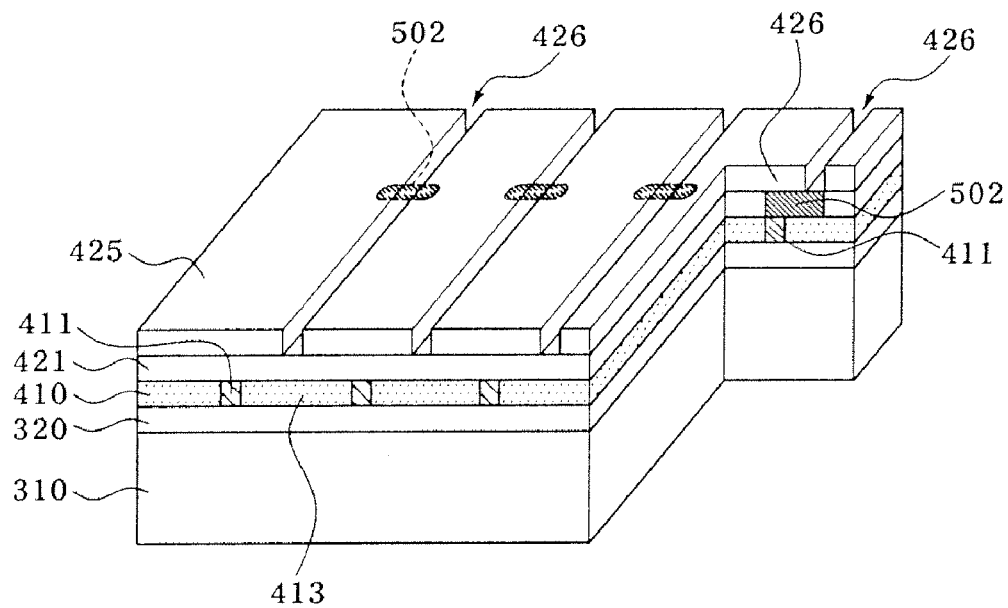
Figure 13:
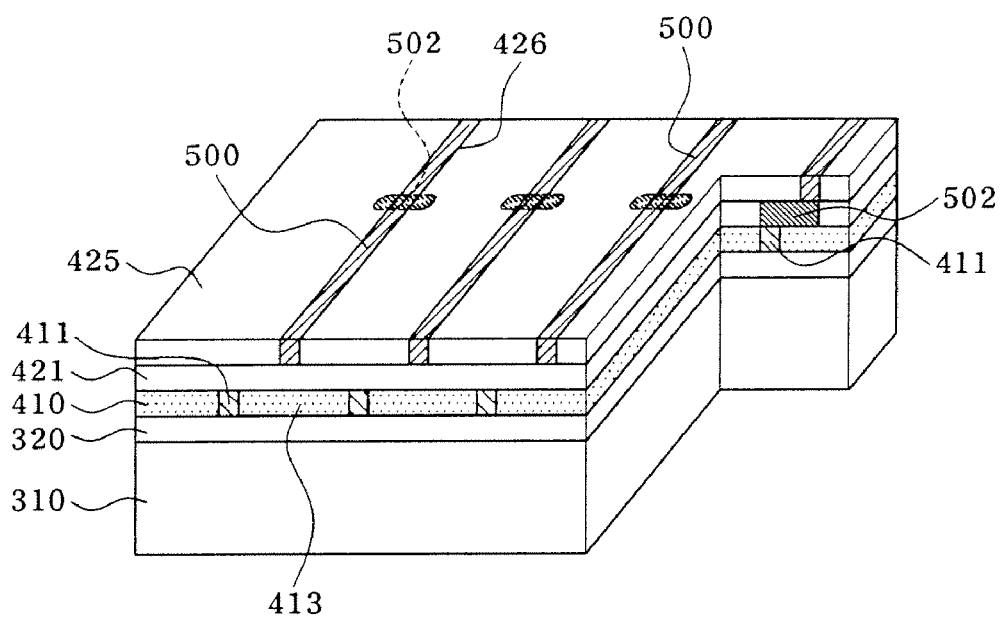

Referring now to FIGS. 12 and 13, an array of linear grooves 426 for patterning the bit line BL 500 and exposes the drain contact 502 is formed by selectively etching the second sub interlayer isolation layer 425. The bit line BL 500 may be formed by directly depositing a conductive layer over the first sub interlayer isolation layer 421 and patterning that deposited conductive layer through a selective etching. Nevertheless, it is more advantageous to apply damascene process in forming the bit line BL 500 of finer critical dimension. Through this damascene process, the linear groove 426 is formed to expose the drain contact 502 and extends parallel to the junction area 411 in the cell string direction. As shown in FIG. 13, the linear groove 426 is filled with, for example, a metal layer such as a tungsten layer and a contact node separation is performed, for example, through a planarization method such as CMP, to firm the bit line BL 500.

Figure 14:
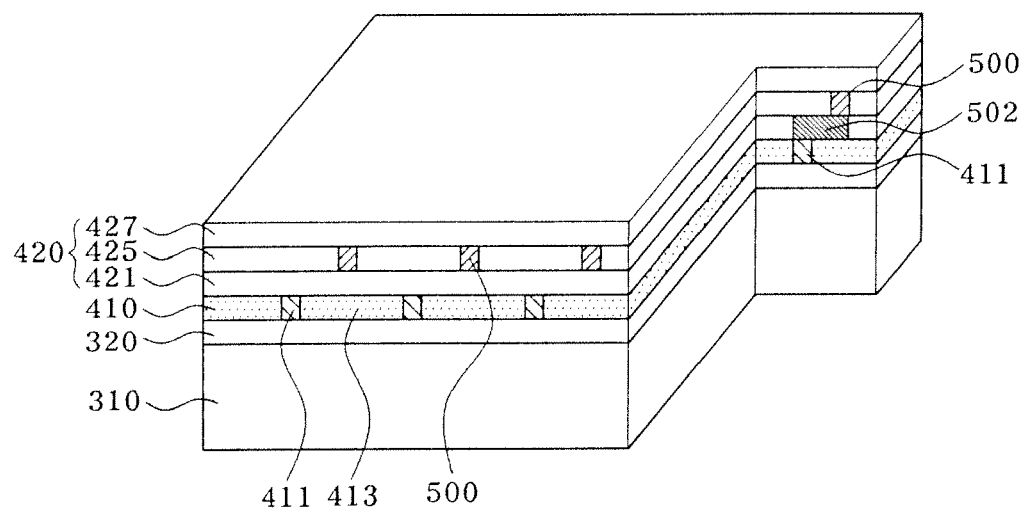

Referring now to FIG. 14, a third sub interlayer isolation layer 427 is deposited, for example, with an insulation material, over the bit line BL 500 and the second sub interlayer isolation layer 425. The sub interlayer isolation layers 421, 425, 427 and the buried bit line 500 collectively form an interlayer isolation layer structure 420 to cover and insulate the semiconductor layer 410.

Figure 15:
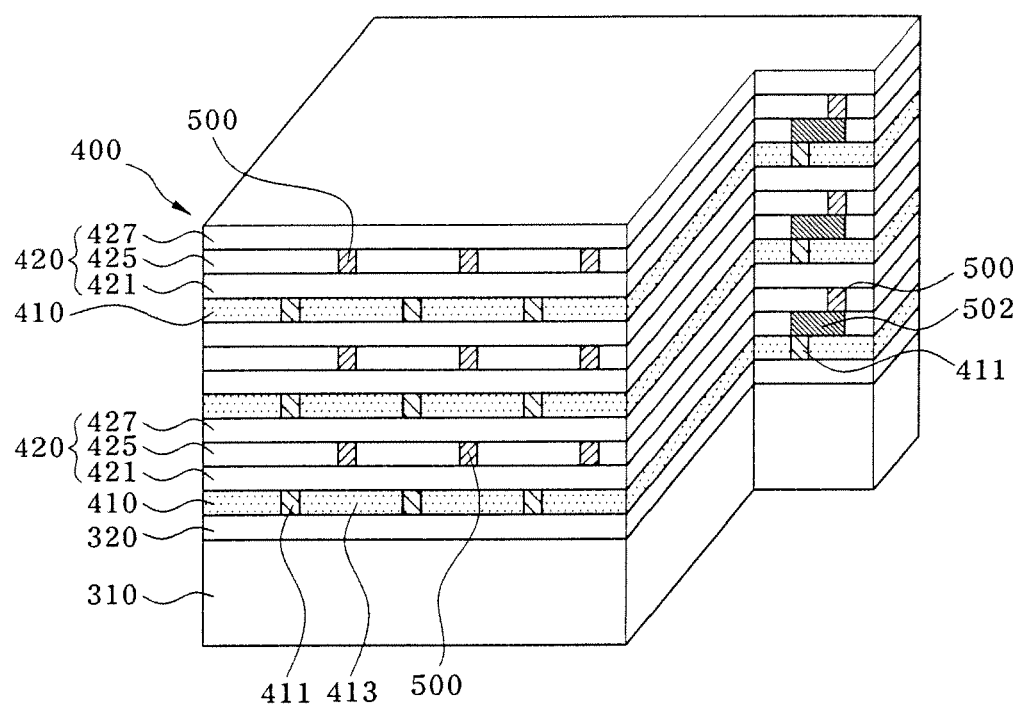
Figure 16:
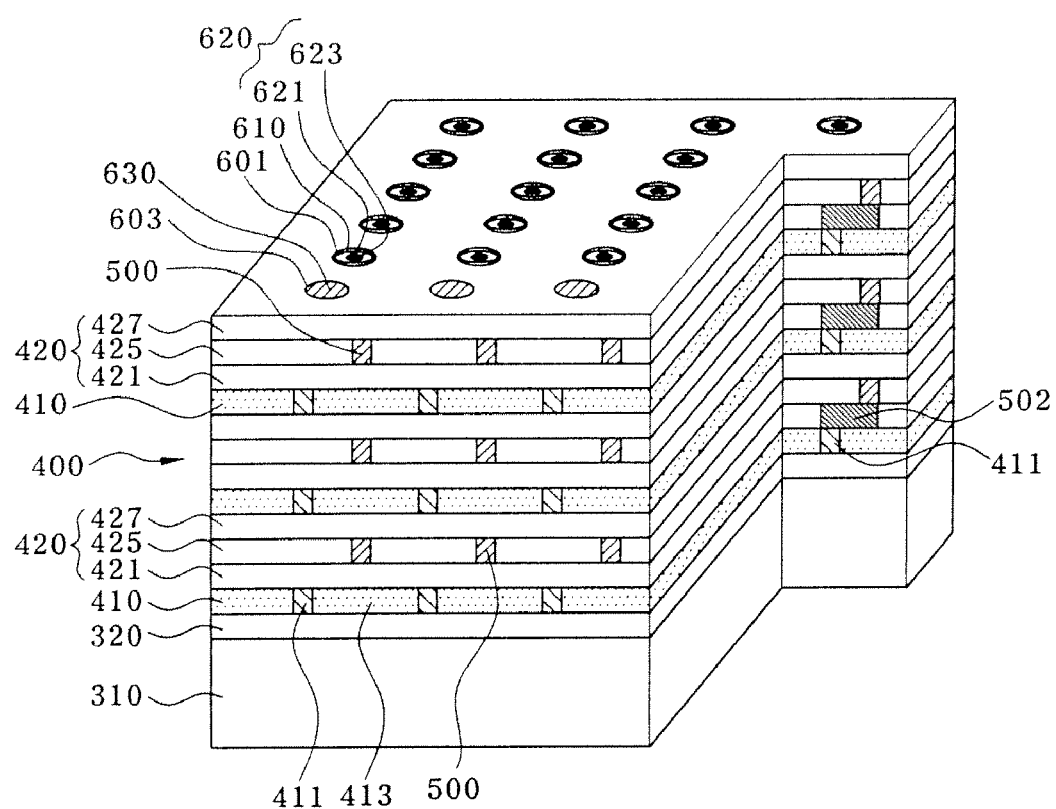
Figure 17:
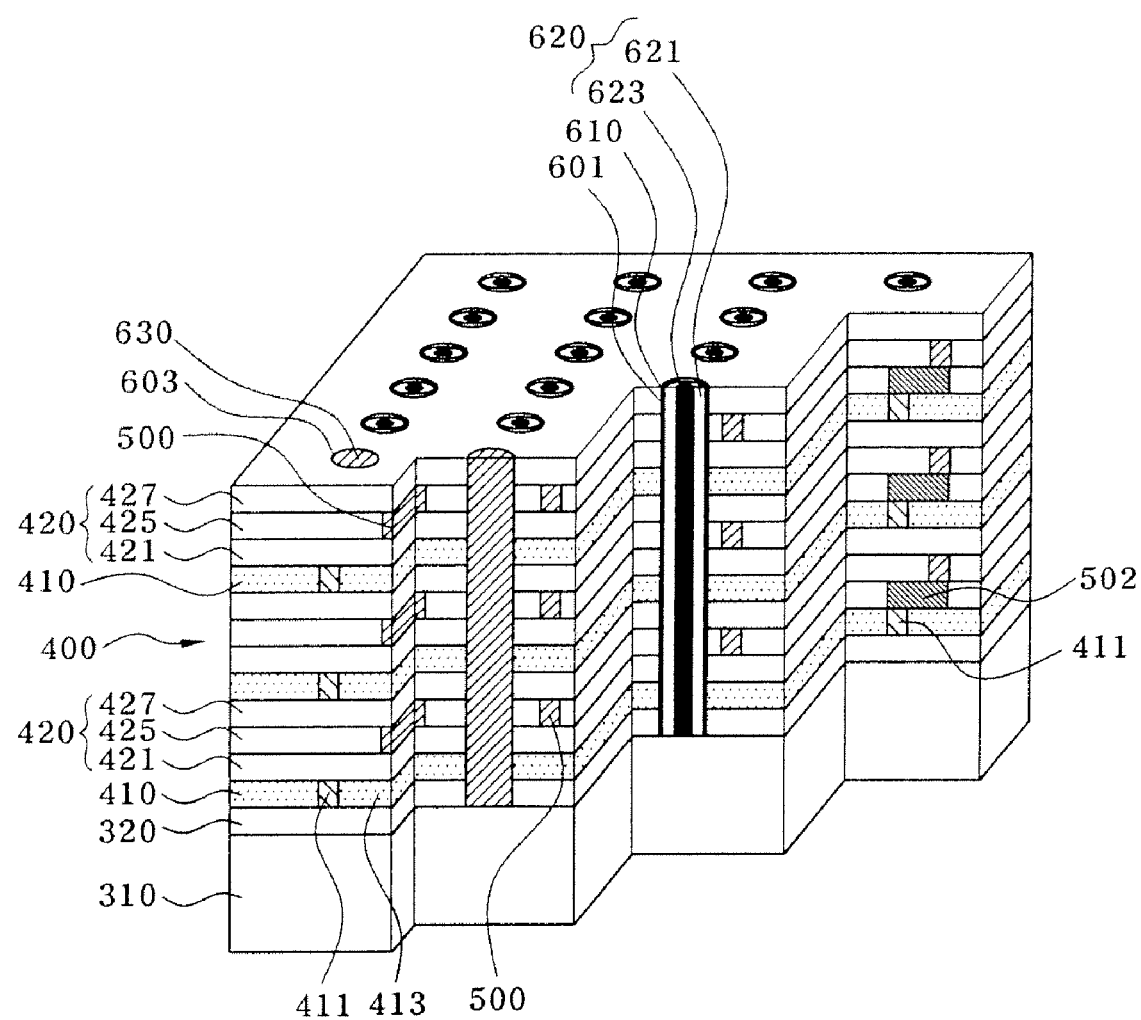

Referring now to FIGS. 15-17, a cell stack 400 is formed by repeatedly stacking the semiconductor layer 410 and the interlayer isolation layer 420 in which the bit line BL 500 is buried. The number of stacking in the cell stack 400 may be varied, depending on the capacity of the flash memory device to be integrated. As shown in FIG. 16, an array of a first through hole 601 that penetrates through the cell stack 400 and exposes the bottom isolation layer is formed. Over the surface of the side wall of the first through hole 601, as shown in FIG. 17, a trap layered stack 610 for charge tunneling and trap for the purpose of storing information in the memory device is introduced. The trap layered stack 610 may be formed, as shown in FIG. 4, to include a stacked structure for charge trap, for example, the tunnel layer 171 for direct charge tunneling over the wall surface of the first through hole 601, the trap layer 173 for the charge trap, and the block layer 175 for restricting undesired back tunneling.

Over this trap layered stack 610, an array of vertical gate columns 620 that fills in the first through hole 601 is formed by depositing, for example, a conductive polysilicon layer 621 and a metal layer 623 such as tungsten (W) layer. As described with reference to FIGS. 1 and 5, the gate column 620 may be used as a word line WL for the cell transistors 1201 that constitutes the NAND cell strings 1203, as the source selection line SSL for the source selection transistor adjacent to the common source line of the NAND cell strings 1203, or as a drain selection line DSL for the drain selection transistor adjacent to the bit line BL 500. The gate column 620 cuts through the middle of the junction area 411 and divides the junction area 411 into first and second junction areas (not shown), similar to the junction areas 137 and 138 (as shown in FIG. 3), disposed at both sides of the gate column 620. Therefore, the channel area 413 is located laterally of the gate column 620.

Referring again to FIGS. 16 and 17, a second through hole 603 that penetrates through the cell stack 400 is formed. The second through hole 603 may be formed at an end of the array of the first through hole 601. A conductive layer, for example, a metal layer such as tungsten layer or a dual layer of polysilicon layer and a metal layer may be deposited to fill in the second through hole 603 and then a contact node separation is carried out with CMP, thereby forming a vertical common source column 630. Like the first through hole 610, the second through hole 603 is arranged in the junction area 411 and the inner side wall of the junction area 411 is exposed. Therefore, the common source column 630 is electrically connected to the junction area 411 and thus connected to the cell string.

The common source column 630 is formed as the common source line CSL, as suggested in FIG. 5. As described above, the common source column 630 and the gate column 620 may be formed in a single process. Alternatively, these columns 620, 630 may be formed separately in dependent processes. Further, it may be possible to form these columns 620, 630 in sequence by forming the first and second through holes 601 and 603 together, depositing and patterning a mask that covers the second through hole 603, forming the gate column 620 in the exposed first through hole 601, and forming the common source column 630 in the second through hole 603. On the contrary, it is possible to form the common source column 630 first and then to form the gate column 620.

Figure 18:
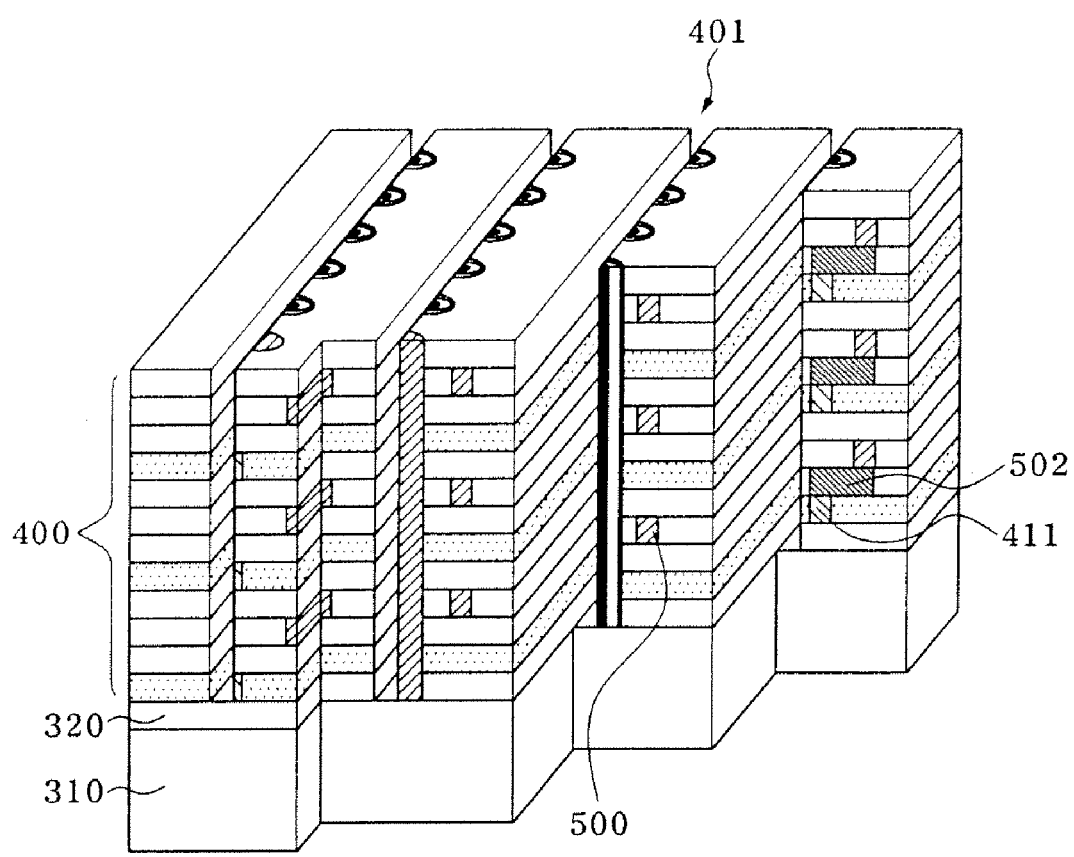
Figure 19:
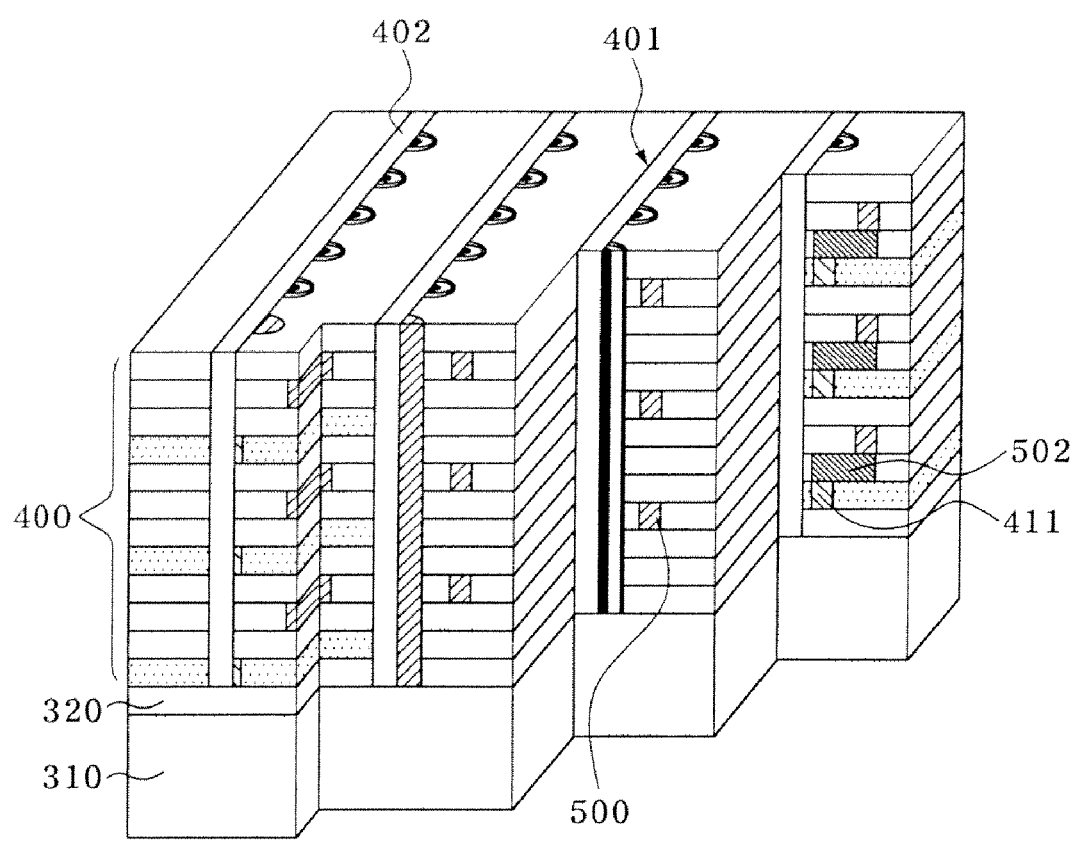
Figure 20:
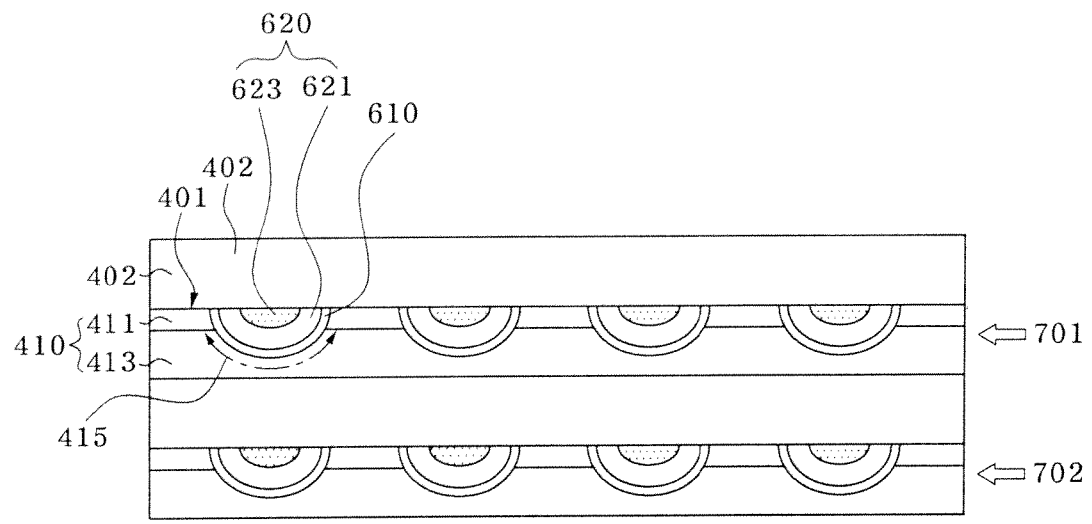

Referring now to FIGS. 18-20, an array of interstack isolation trenches 401 and an interstack isolation layer 402 filled in the interstack isolation trench 401 are formed, to isolate the adjacent cell strings in the respective semiconductor layers 410. Referring to FIG. 18, the interstack isolation trench 401 is formed by selectively removing a portion of the cell stack 400 and a portion of the first and second through holes 601, 603 filled with the columns 620, 630, until the bottom isolation layer 320 is exposed. Also, the interstack isolation trench 401 is formed and extended in the cell string direction to isolate between the cell strings. Meanwhile, the interstack isolation trench 401 is formed apart from the bit line BL 500. The bit line BL 500 is disposed at the position that is laterally spaced apart from the stripe of the junction area 411 and overlapped on the portion of the channel area 413, and extends in parallel along the extending direction of the stripe of the junction area 411. Therefore, the interstack isolation trench 401 is formed so as to be overlapped in another portion of the channel area 413 opposite to the portion of the channel area 413 with the overlappedly disposed bit lines 500.

Referring to FIG. 19, the interstack isolation layer 402 is formed by depositing, for example, an insulation material in the interstack isolation trench 401. The interstack isolation layer 402 isolates one array of the gate column 620 from another array of the gate column 620 and thus isolates between the cell strings in the semiconductor layer 410.

Meanwhile, the interstack isolation trench 401 may be expanded so as to further overlapped some portion of the junction area 411 adjacent to the channel area 413 and some portion of the gate column 620 and the common source column 630. In other words, half of the gate column 620 may be removed by forming the interstack isolation trench 401. In this case, as shown in the planar layout of FIG. 20, the cylindrical gate column 620 may be deformed to a semi-cylindrical shape in that half of the gate column 620 is cut out. Therefore, the remaining half of the gate column 620 is laterally overlapped in the channel area 413, and the junction area 411 is disposed at both ends of the gate column 620. A cell current 415 through the channel area 413 between the junction areas 411 may be carried out by the gate column 620 independently in respective cell strings 701 and 702. As such, the interstack isolation trench 401 filled with the interstack isolation layer 402, and formed between the first and second cell strings 701, 702, isolates the first cell string 701 and the second cell string 702 from each other in the same semiconductor layer 410.

The above embodiment of the invention may be modified so that the cell transistors that constitute the memory cell are connected in a shape of a NAND cell string in the direction in which the striped shape of the junction area extends and the bit lines BLs connected to one end of the cell string are buried within the interlayer isolation layer so as to extend in a direction perpendicular to the cell string direction on a plane.

Figure 21:
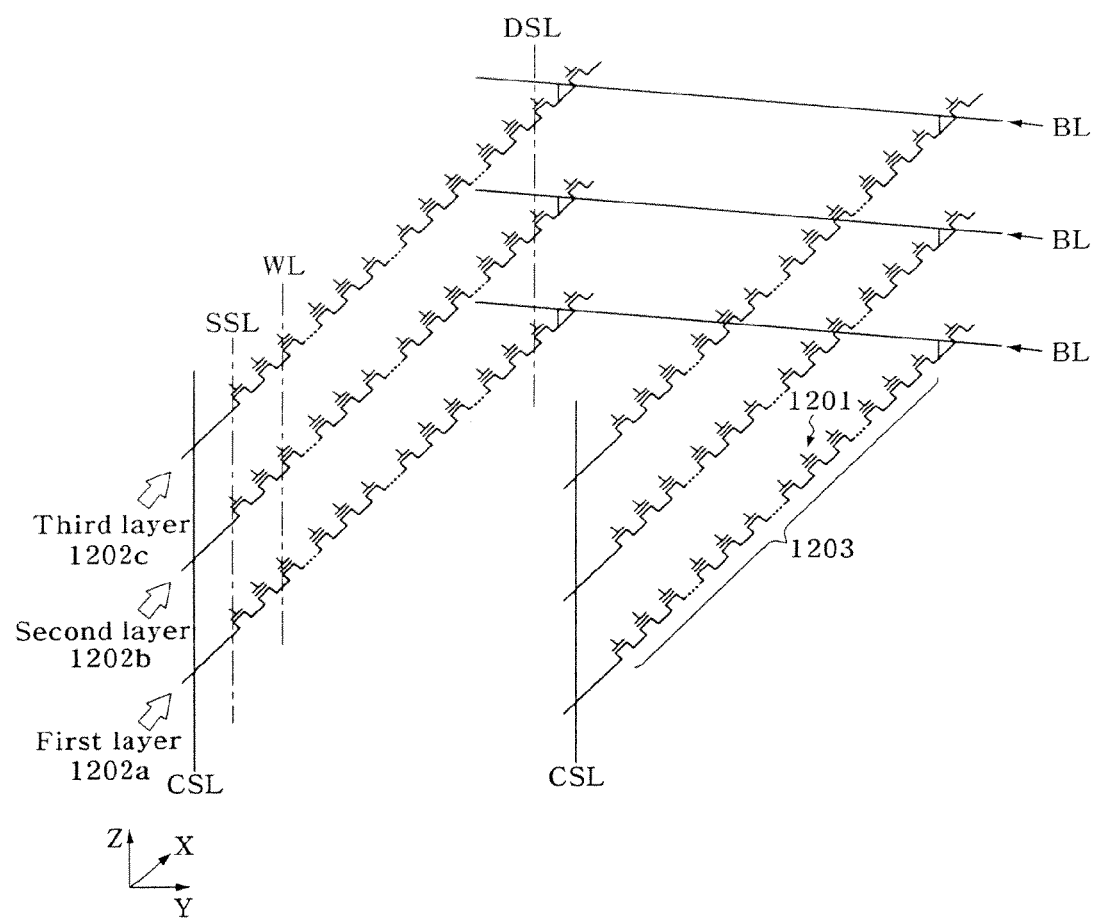
FIG. 21 is a view illustrating a cell array of a flash memory device in accordance with a modified embodiment of the invention.
Figure 22:
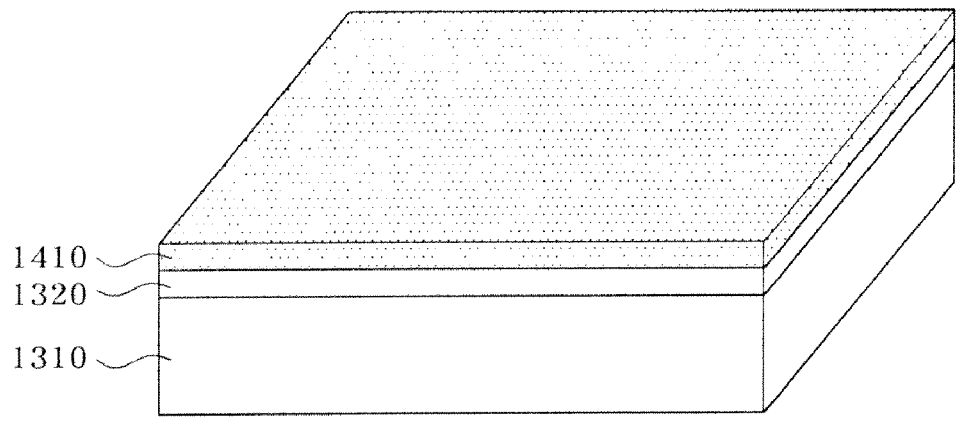
FIGS. 22 to 34 are views illustrating the process steps of manufacturing the flash memory device in accordance with a modified embodiment of the invention.

FIG. 21 is a view illustrating a cell array of a flash memory device in accordance with an embodiment of the invention. Referring now to FIG. 21 together with FIG. 20, the cell transistors 1201 may include the gate column 620 and the junction and the channel areas 411, 413 of the semiconductor layer 410, and the cell transistors 1201 formed in respective a first layer 1202*a*, a second layer 1202*b* and a third layer 1202*c* are connected to the word line WL of the vertical gate column 620. Also, in the respective layers 1202*a*, 1202*b*, 1202*c*, the cell transistors 1201 are arranged in the X-axis direction, i.e. the cell string direction in which the junction area 411 extends and are connected in plural by the junction area 411 to constitute the cell strings 1203. The cell strings 1203 in the first, second and third layers 1202*a*, 1202*b*, 1202*c* are common to the vertical common source line CSL. Therefore, the common source line CSL is, like the gate column 620, also introduced so as to penetrate through the cell stack 400. Unlike the gate column 620, the common source line CSL is not provided with the trap layered stack 610 and this common source line CSL is in contact with the junction area 411 of the semiconductor layer 410 to directly and electrically connected to the junction area 411. The gate column 620 adjacent to the common source line CSL may be used as the source selection line SSL.

The bit line BL connected to the cell strings 1203 is introduced separately and independently in the respective layers 1202*a*, 1202*b*, 1202*c*. At this time, two cell strings 1203 are electrically connected to both sides of the bit line BL. Meanwhile, the bit line BL is disposed so as to extend in a cell string direction in which the cell strings 1203 extend, i.e. the Y-axis direction perpendicular to the X-axis direction on an XY plane. As such, in consideration of forming the cell array, the bit lines BLs are stacked so as to extend in a direction perpendicular to the cell string direction. The bit line BL may be formed in a structure that is buried in the interstack isolation trench 401 of the cell stack 400, i.e. a buried bit line BL structure.

Referring now to FIGS. 22-34, a bottom isolation layer 1320 is deposited, with an insulation material such as silicon oxide, over a semiconductor substrate 1310 such as a p-type silicon (Si) substrate doped with p-type impurities as dopant. A semiconductor layer 1410 such as a p-type Si layer doped with p-type impurities as dopant is deposited over the bottom isolation layer 1320.

Figure 23:
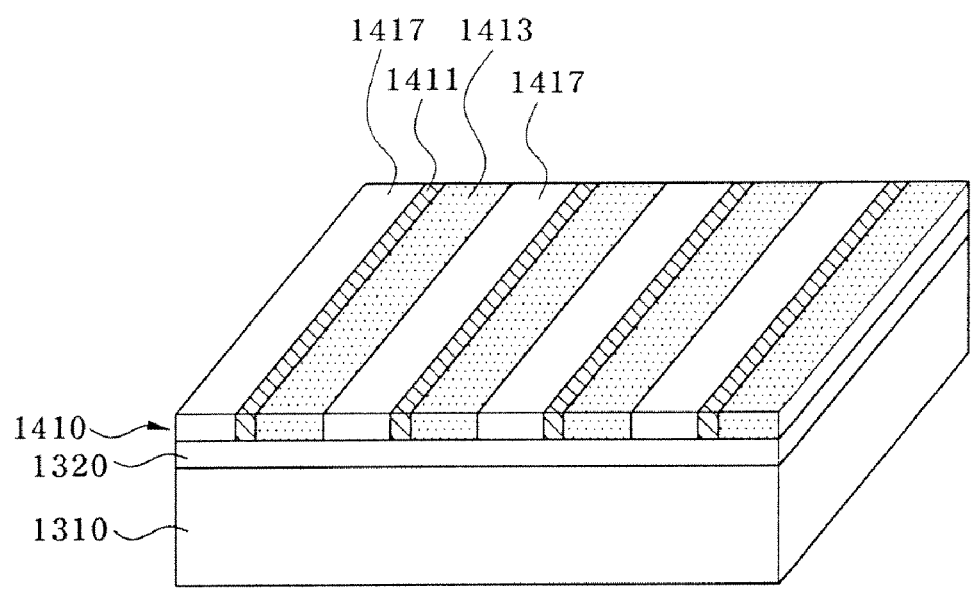

Referring now to FIG. 23, an array of junction area 1411 is formed, for example, in a stripe layout and extends in a predetermined direction, e.g. the NAND cell string direction, by doping n-type impurities that are opposite conductive type on the semiconductor layer 1410 through a selective ion implantation using an ion implantation mask. A channel area 1413 and an interstring isolation layer 1417 set at an outer area of the channel area 1413 are set between the junction area 1411 and other adjacent junction area 1411. Therefore, the stripe of the junction area 1411, the stripe of the channel area 1413, and the stripe of the interstring isolation layer 1417 are repeatedly disposed in a Y-axis direction in the semiconductor layer 1410. On the channel area 1413, the ion implantation for adjusting a threshold voltage of the cell transistor may be carried out.

In order to form the interstring isolation layer 1417 in the semiconductor layer 1410, a trench is formed by selectively etching the semiconductor layer 1410 and then the interstring isolation layer 1417 is formed by depositing an insulation material such as silicon oxide that fills in the trench. This process of forming the interstring isolation layer 1417 may be carried out by oxidating the area to be formed to the interstring isolation layer 1417 through selective oxidation using a mask. Alternatively, the process of forming the interstring isolation layer 1417 may be carried out prior to the selective ion implantation process for forming the junction area 1411, or prior to the selective ion implantation process for adjusting the threshold voltage. The ion implantation for adjusting the threshold voltage may be carried out prior to the ion implantation for forming the junction area 1411.

Figure 24:
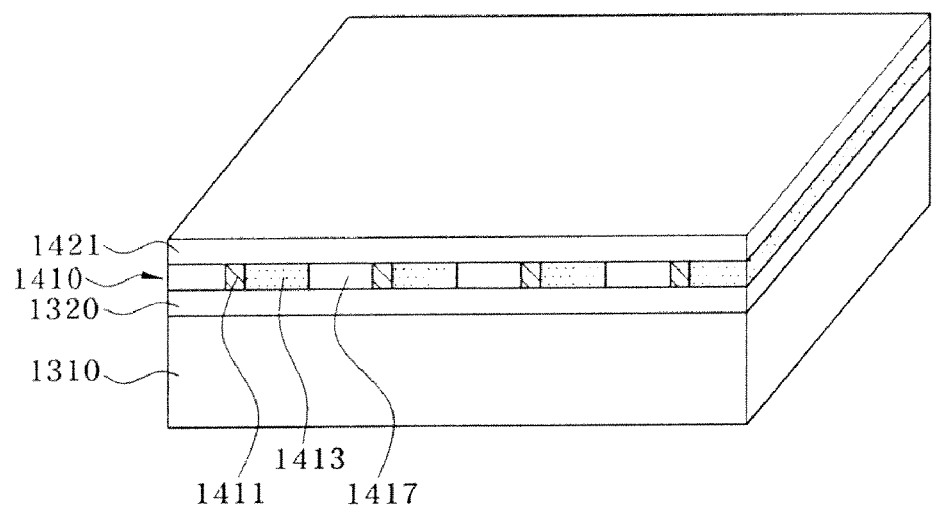
Figure 25:
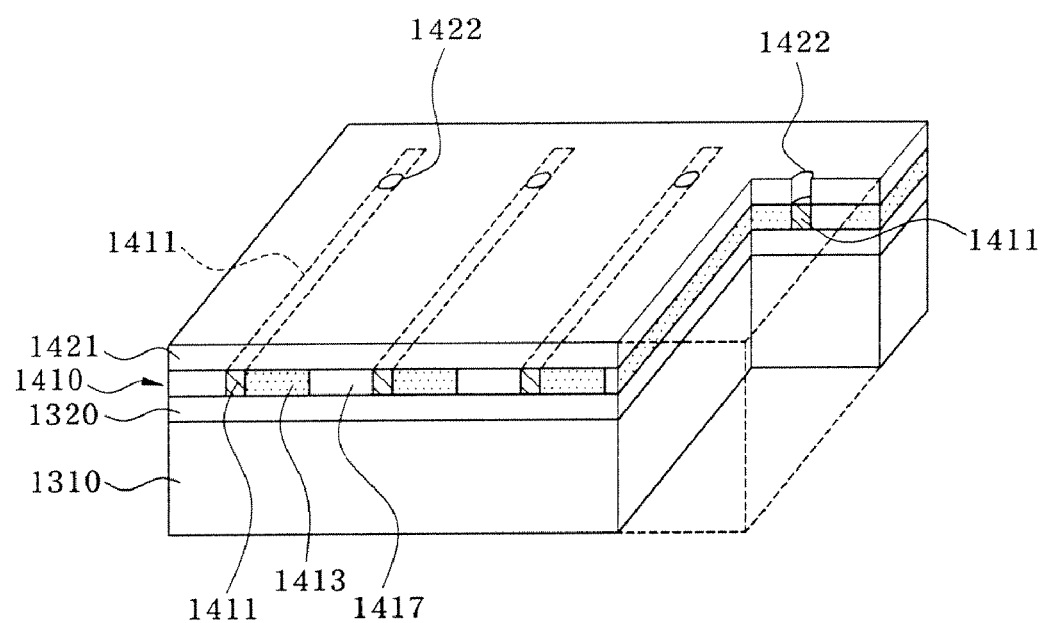

As shown in FIGS. 24 and 25, a first sub interlayer isolation layer 1421 for insulation is formed over the semiconductor layer 410 and the interstring isolation layer 1417 by depositing an insulation material such as silicon oxide. In order to form a drain contact 1502 connected to a drain in the junction area 1411, an array of contact holes 1422 that penetrates through the first sub interlayer isolation layer 1421 is formed. This contact hole 1422 exposes some portion of the junction area 1411 of the semiconductor layer 1410. After that, an ion implantation for improving a contact resistance may be carried out on the exposed portion of the semiconductor layer 1410.

Figure 26:
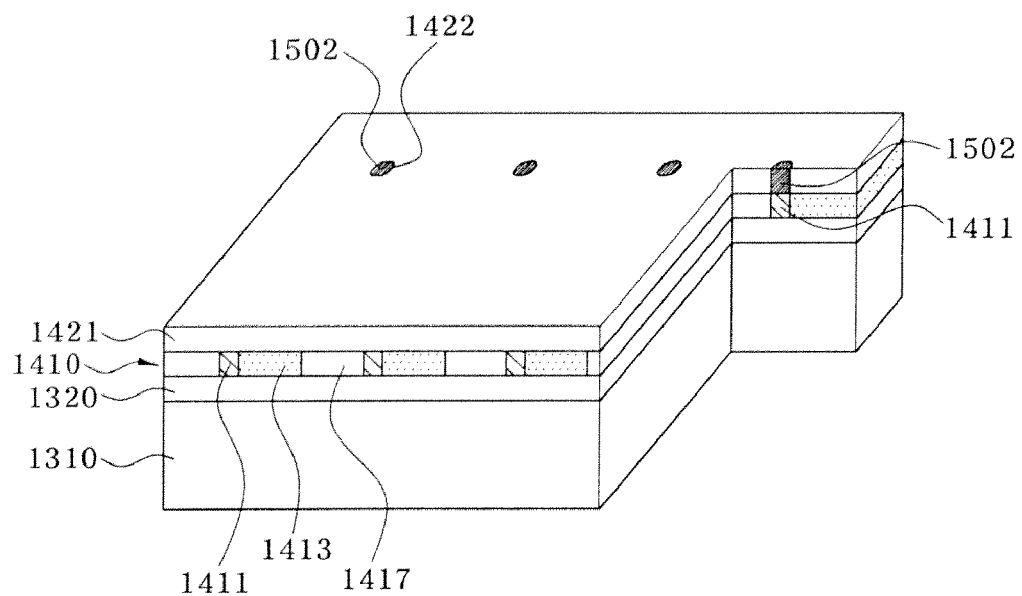

Referring now to FIG. 26, a drain contact 1502 is formed by depositing, for example, a conductive material for filling in the contact hole 1422, e.g. a conductive polysilicon layer or a metal layer such as tungsten (W) layer and then performing a contact node separation through a planarization method such as chemical mechanical polishing (CMP).

Figure 27:
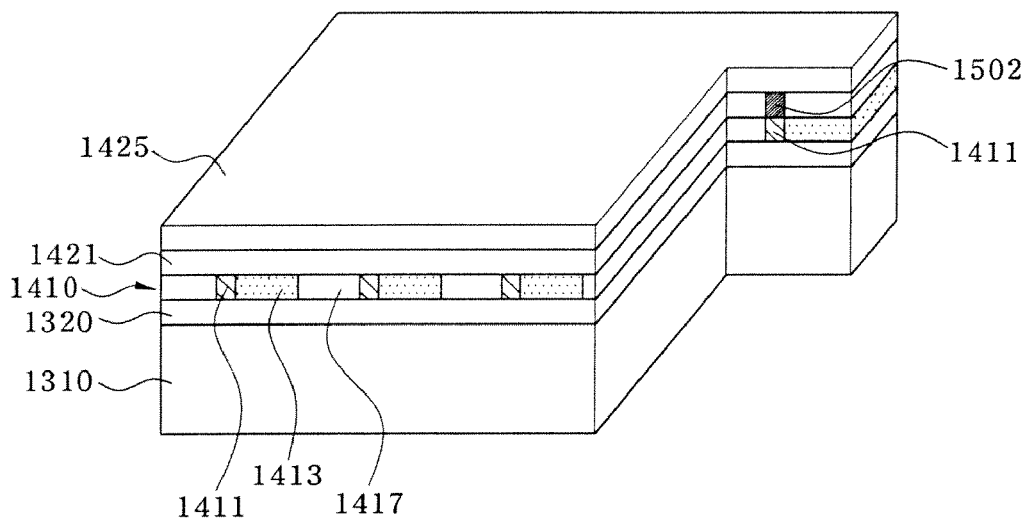
Figure 28:
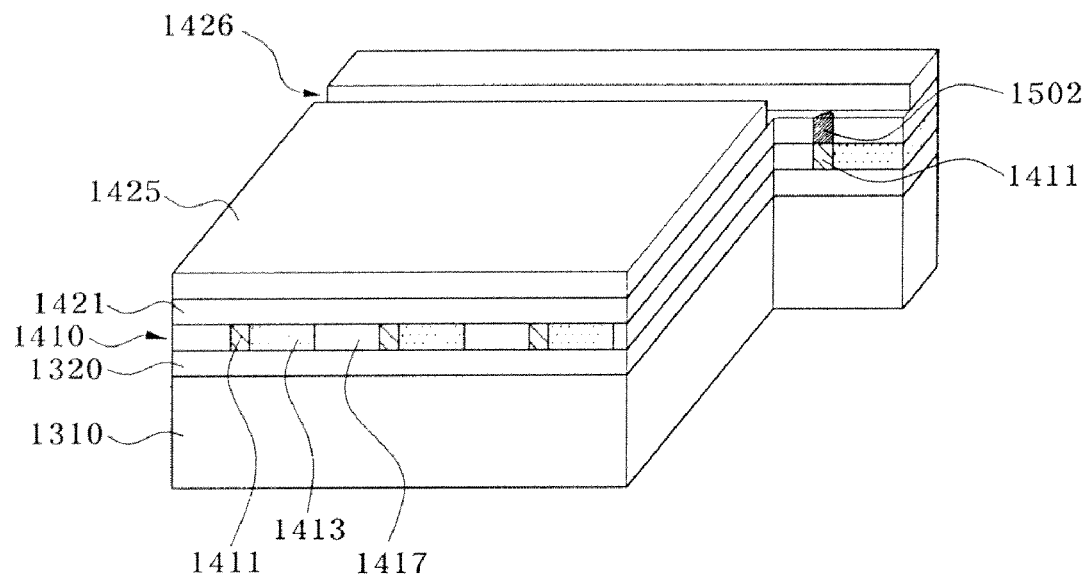

A second sub interlayer isolation layer 1425 is formed by depositing, for example, an insulation material over the first sub interlayer isolation layer 1421, as shown in FIG. 27. an array of linear grooves 1426 for patterning the bit line and exposes the drain contact 1502 is formed by selectively etching the second sub interlayer isolation layer 1425, as depicted in FIG. 28. The bit line BL 1500 is formed over the first sub interlayer isolation layer 1421, and the pattern of the bit line BL 1500 may be formed by directly depositing a conductive layer over the first sub interlayer isolation layer 1421 and patterning the deposited conductive layer through a selective etching. Nevertheless, it is more advantageous to apply damascene process in forming the bit line of finer critical dimension. Through this damascene process, the linear groove 1426 is formed so as to expose the drain contact 1502 and extend in a direction that is perpendicular to the cell string direction and also perpendicular to the extending direction of the junction area 1411.

Figure 29:
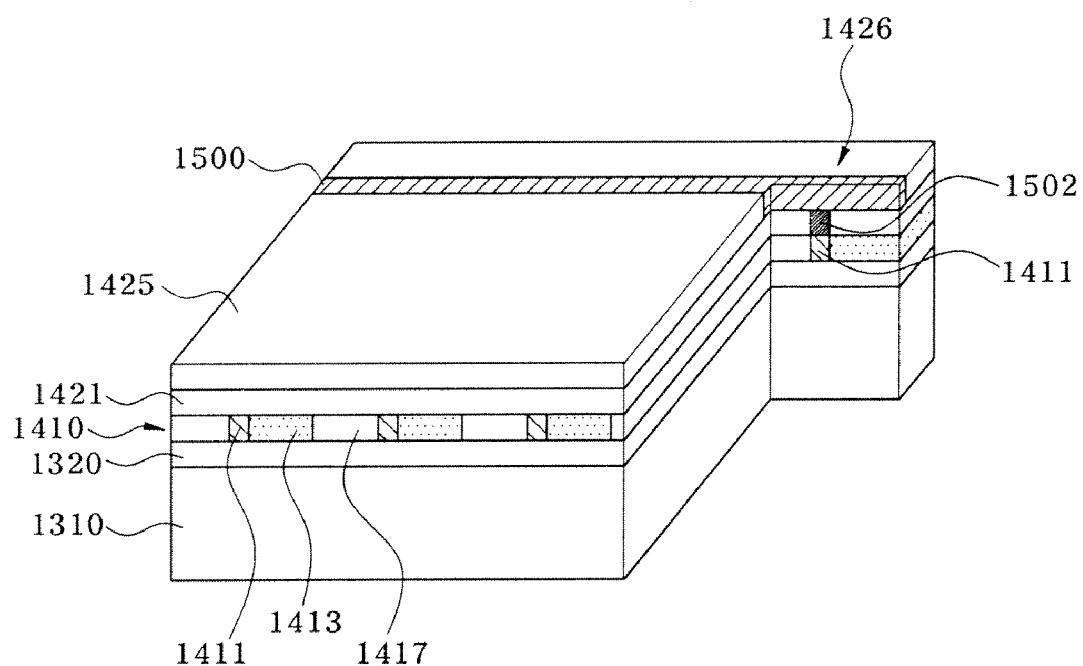

Referring now to FIG. 29, the bit line BL 1500 is formed by depositing a conductive layer for filling the linear groove 1426, e.g. a metal layer such a tungsten layer and performing node separation through a planarization method such as CMP.

Figure 30:
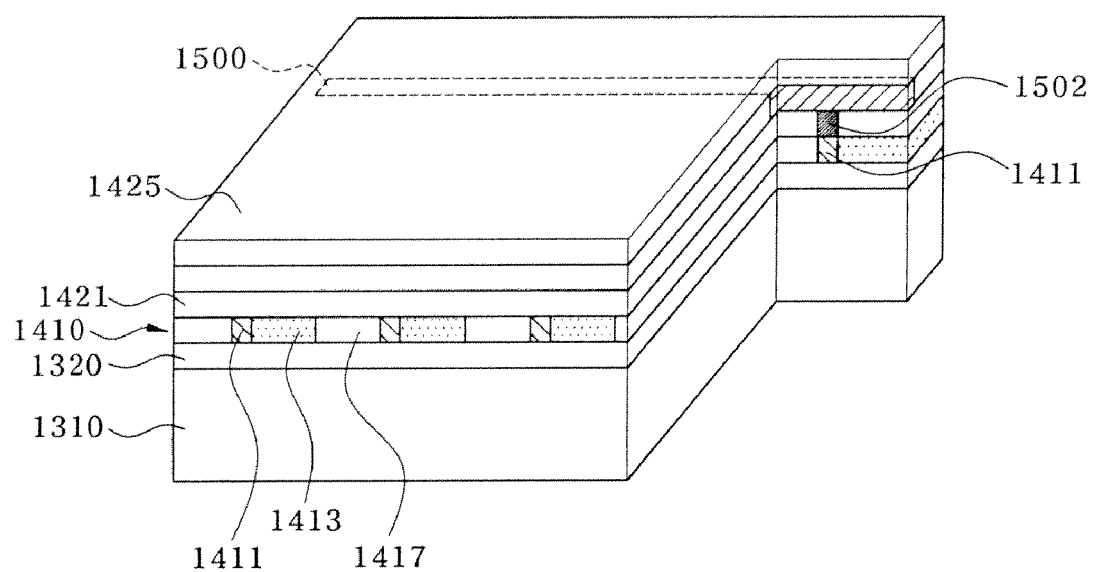

Referring now to FIG. 30, a third sub interlayer isolation layer 1427 for covering the bit line BL 1500 and the second sub interlayer isolation layer 1425 is deposited with an insulation material. The sub interlayer isolation layers 1421, 1425, 1427 and the buried bit line BL 1500 collectively form an interlayer isolation layer structrue 1420 to cover and insulate the semiconductor layer 1410.

Figure 31:
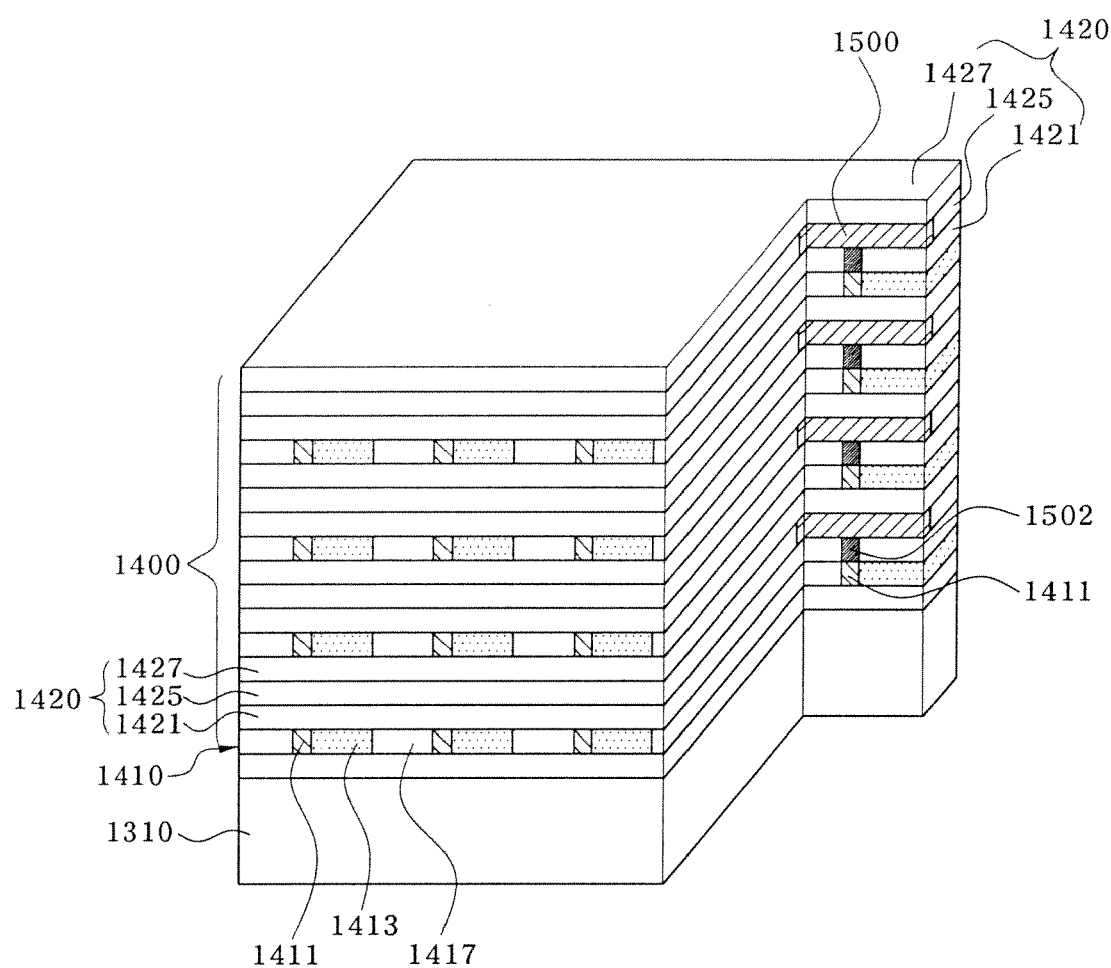
Figure 32:
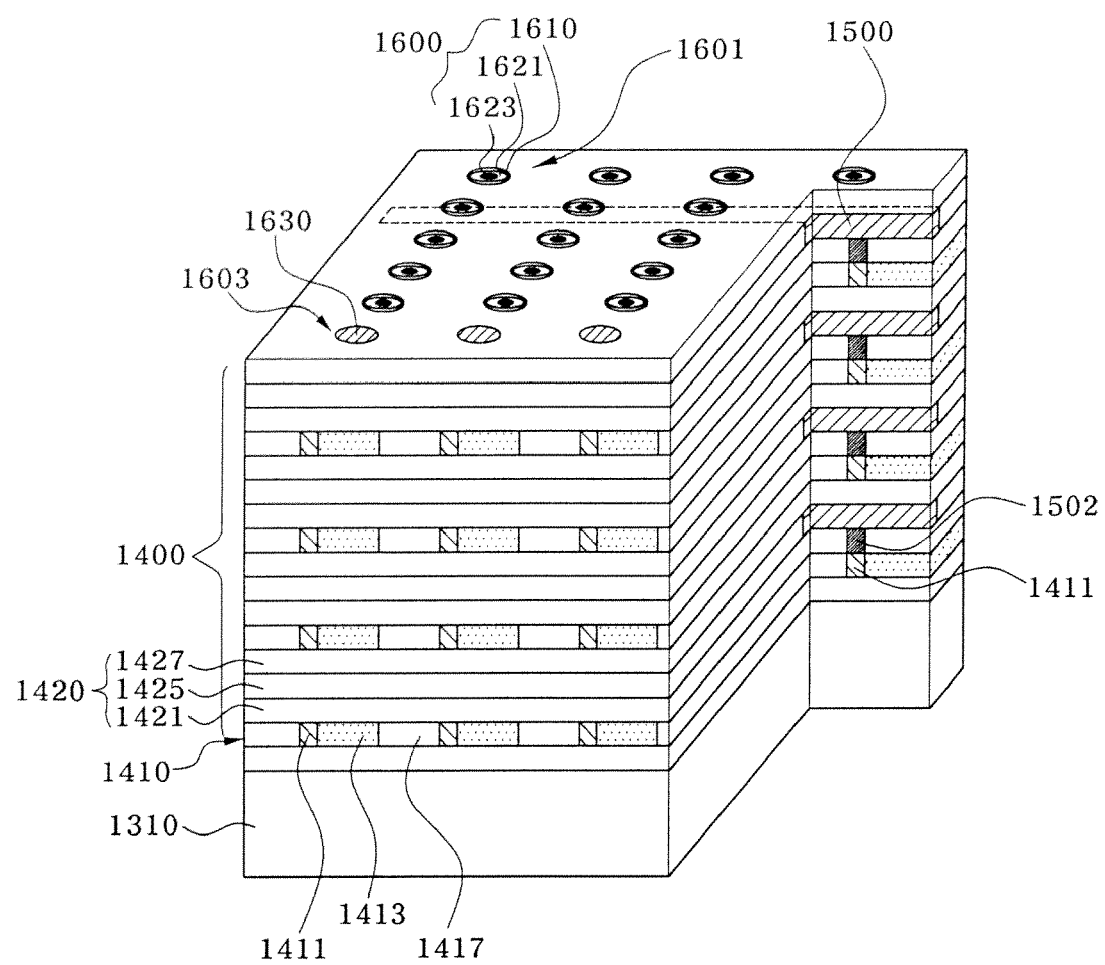
Figure 33:
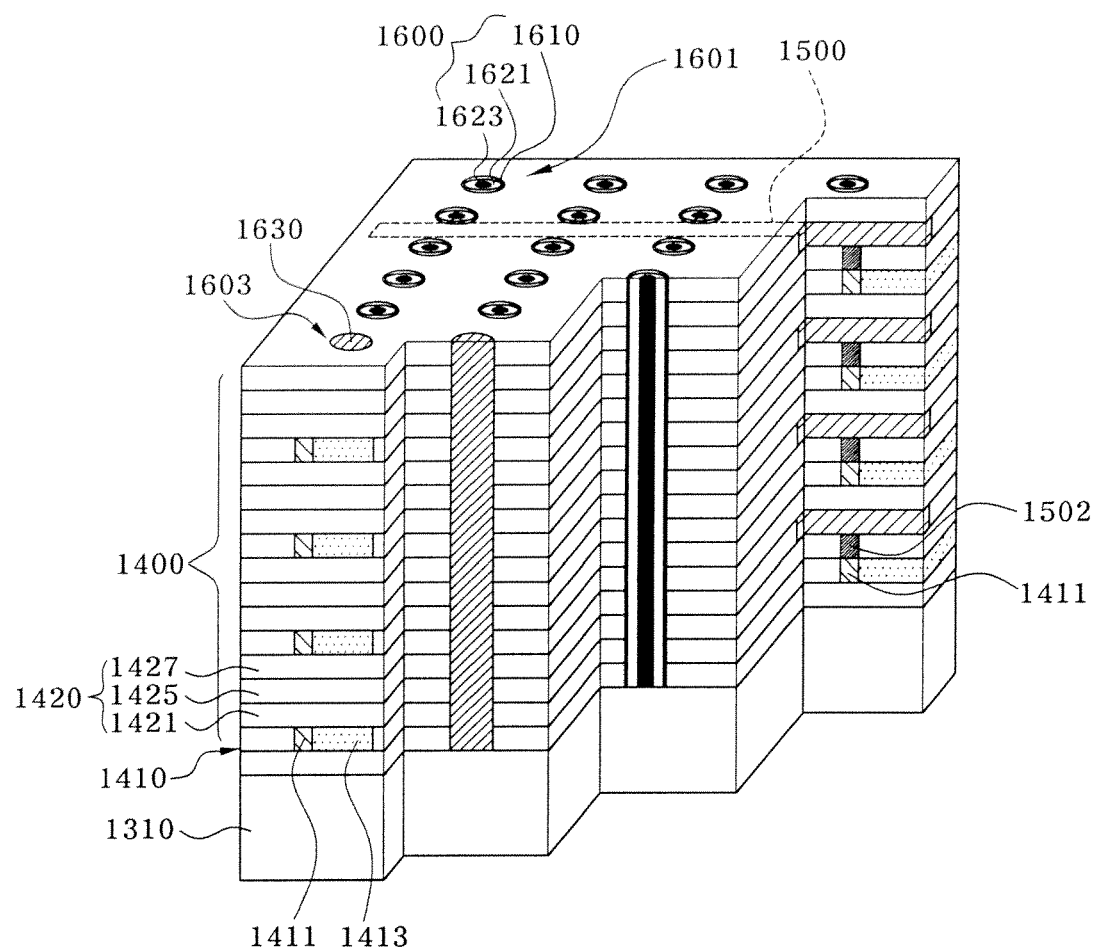
Figure 34:
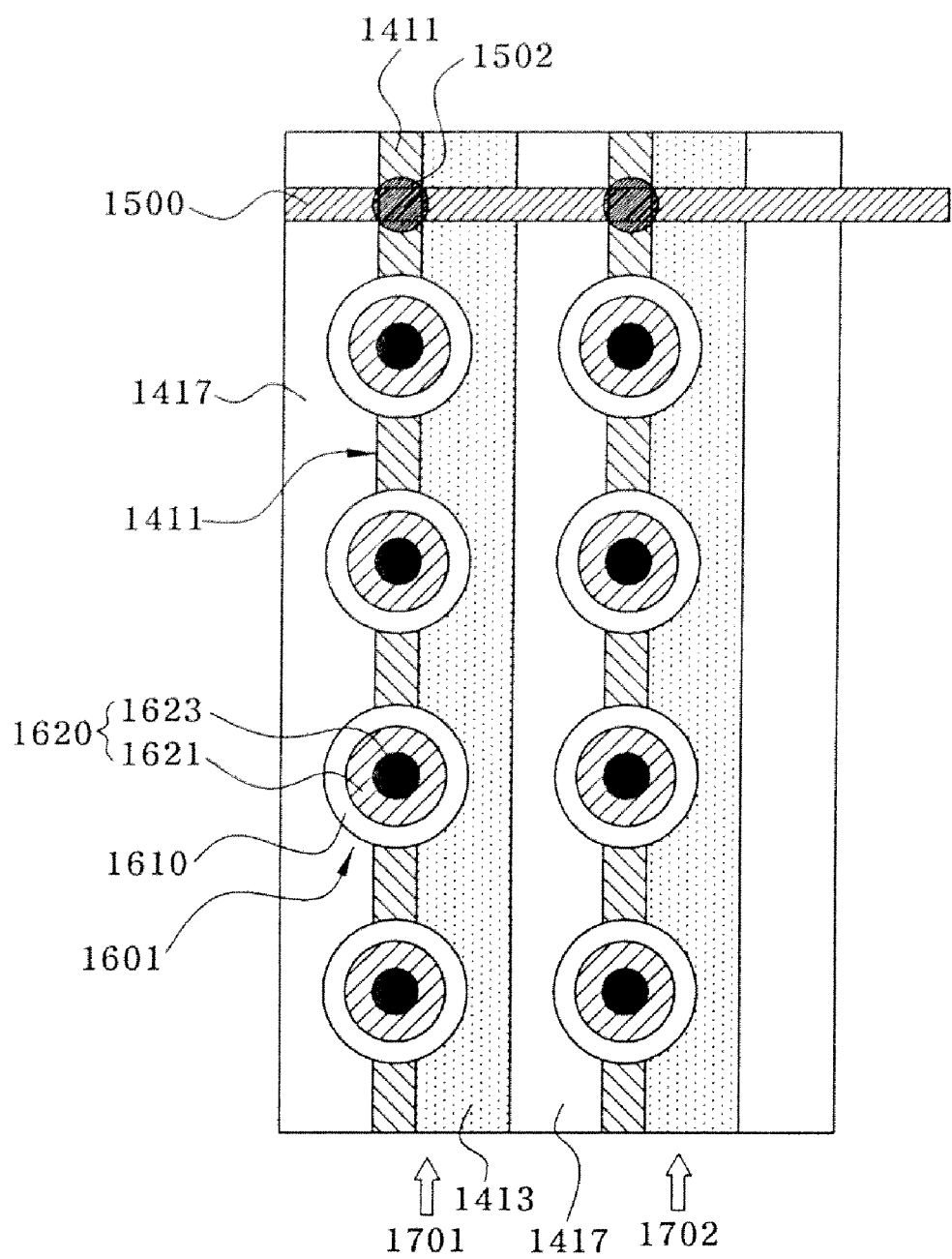

Referring now to FIGS. 31-33, the cell stack 1400 is formed by repeatedly stacking the semiconductor layer 1410 and the interlayer isolation layer 1420 in which the bit line BL 1500 is buried. At this time, the number of stacking in the cell stack 1400 may be varied, depending on the capacity of the flash memory device to be integrated. An array of a first through hole 1601 that penetrates through the cell stack 1400 and exposes the bottom isolation layer 1320 is formed. Over the surface of the side wall of the first through hole 1601, as shown in FIG. 33, a trap layered stack 1610 for charge tunneling and trap for the purpose of storing information in the memory device is introduced. The trap layered stack 1610 may be formed, as shown in FIG. 4, and include a stacked structure for charge trap, for example, the tunnel layer 171 for direct charge tunneling over the wall surface of the first through hole 1601, the trap layer 173 for the charge trap and the block layer 175 for restricting undesired back tnneling.

Over this trap layered stack 1610, an array of vertical gate columns 1620 that fills in the first through hole 1601 is formed by depositing, for example, a conductive polysilicon layer 1621 and a metal layer 1623 such as tungsten (W) layer. As described with reference to FIG. 21, the gate column 1620 may be used as a word line WL for the cell transistors 1201 constituting the NAND cell string 1203, as the source selection line SSL for the source selection transistor adjacent to the common source line of the NAND cell string, or as a drain selection line DSL for the drain selection transistor adjacent to the bit line BL. The gate column 1620 cuts through the middle stripe of the junction area 131 to divide the junction area into the junction areas (not shown) disposed at both sides of the gate column 1620 (or 180 in FIG. 3). Therefore, the channel area 1413 is located laterally of the gate column 1620. At this time, the first through hole 1601 for the gate column 1620 may be formed to cut some portion of the interstring isolation layer 1417. Therefore, the gate column 1620 may penetrate through the cell stack 1400 so as to cut the middle of the channel area 1411.

Referring again to FIGS. 32 and 33, a second through hole 1603 that penetrates through the cell stack 1400 is formed. The second through hole 1603 may be formed at an end of the array of the first through hole 1601. A conductive layer, for example, a metal layer such as tungsten layer or a dual layer of polysilicon layer and a metal layer may be deposited to fill in the second through hole 1603 and a contact node separation is carried out with CMP, thereby forming a vertical common source column 1630. Like the first through hole 1610, the second through hole 1603 is arranged in the junction area 1411 and formed so that the side wall of the junction area 1411 is exposed. Therefore, the common source column 1630 is electrically connected to the junction area 1411 and thus connected to the cell string.

The common source column 1630 is formed as the common source line CSL, as suggested in FIG. 21. As described above, the common source column 1630 and the gate column 1620 may be formed together at the same time or separately in dependent processes. For example, it may be possible to form the columns 1620, 1630 in sequence of forming the first and second through holes 1601 and 1603 together, depositing and patterning a mask that covers the second through hole 1603, forming the gate column 1620 in the exposed first through hole 1601, and forming the common source column 1630 in the second through hole 1603. On the contrary, it is possible to form the common source column 1630 first and then to form the gate column 1620.

After the vertical gate column 1620 is formed as shown in FIGS. 32 and 33, the cylindrical gate column 1620 penetrates through the cell stack 1400 so as to cut the middle of the junction area 1411. The cylindrical gate column 1620 is laterally overlapped on the channel area 1413, and the junction area 1411 is disposed at both ends of the gate column 1620. In another direction of the gate column 1620 that is opposite to the channel area 1413, the interstring isolation layer 1417 is disposed and a first cell string 1701 and a second cell string 1702 may be isolated from each other in the same semiconductor layer 1410.

As is apparent from the above description, the flash memory device in accordance with the invention includes the cell stack formed by stacking the semiconductor layer and the interlayer isolation layer, the gate column and the common source column introduced in vertical direction so as to penetrate the cell stack, and the bit line buried in the interlayer isolation layer and thus cell transistors and the NAND cell strings are stacked in three-dimension. Therefore, it is possible to overcome the limitation in integration degree of a memory device due to limitation in surface area of the substrate and thus realize a memory device capable of storing larger amount of information.

While the invention has been described with respect to the specific embodiments, it will be apparent to those skilled in the art that various changes and modifications may be made without departing from the spirit and scope of the invention as defined in the following claims.

What is claimed is:

1. A flash memory device, comprising:
   a substrate;
   a cell stack comprising a plurality of cell stack layers, each cell stack layer comprising:
   a semiconductor layer for providing junction areas and channel areas,
   the semiconductor layer including a silicon layer doped with first type impurities,
   each junction area including an impurity-doped area in a shape of a stripe formed by doping second type impurities on some area of the silicon layer, and
   each junction area extending in a direction along which a NAND cell string extends;
   an interlayer isolation layer which insulates the semiconductor layer and is provided with a bit line buried therein, the bit line being connected to the junction areas and extending in a direction perpendicular to a cell string direction, wherein the semiconductor layer and the interlayer isolation layer are repeatedly stacked;
   an array of gate columns, each gate columns penetrating through the cell stack, perpendicular to the substrate and cutting through the junction areas to dispose the junction areas at both sides thereof; and
   a trap layered stack disposed at an interface between each of the gate columns and the cell stack to store charge.

2. The flash memory device as set forth in claim 1, further comprising an interstring isolation layer in the semiconductor layer, which insulates the channel areas and the junction areas and extends in the cell string direction.

3. The flash memory device as set forth in claim 1, wherein the first type impurity is p-type impurity and the second type impurity is n-type impurity.

\* \* \* \* \*